(12) United States Patent  
Park et al.

(10) Patent No.: US 11,830,885 B2
(45) Date of Patent: Nov. 28, 2023

(54) DISPLAY DEVICE

(71) Applicant: Samsung Display Co., LTD., Yongin-si (KR)

(72) Inventors: Do Yeong Park, Hwaseong-si (KR); No Kyung Park, Hwaseong-si (KR); Kyung Bae Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 140 days.

(21) Appl. No.: 17/339,271

(22) Filed: Jun. 4, 2021

(65) Prior Publication Data
US 2021/0399022 A1  Dec. 23, 2021

(30) Foreign Application Priority Data

Jun. 22, 2020  (KR) .................. 10-2020-0075552

(51) Int. Cl.
*H01L 27/12* (2006.01)
*H01L 25/16* (2023.01)
*H01L 23/00* (2006.01)

(52) U.S. Cl.
CPC ........ *H01L 27/1244* (2013.01); *H01L 25/167* (2013.01); *H01L 27/124* (2013.01); *H01L 27/1255* (2013.01); *H01L 24/24* (2013.01); *H01L 24/82* (2013.01); *H01L 2224/24147* (2013.01); *H01L 2224/82143* (2013.01); *H01L 2924/12041* (2013.01); *H01L 2924/1426* (2013.01)

(58) Field of Classification Search
CPC ........ H01L 27/1214–1296; H01L 27/32–3293
See application file for complete search history.

(56) References Cited

U.S. PATENT DOCUMENTS

| | | | |
|---|---|---|---|
| 2003/0071771 A1* | 4/2003 | Kimura ............... | G09G 3/3233 345/76 |
| 2008/0265254 A1* | 10/2008 | Nishiura ............. | H01L 27/1255 257/E27.113 |
| 2015/0129877 A1* | 5/2015 | Cho ................... | G02F 1/134363 438/155 |

(Continued)

FOREIGN PATENT DOCUMENTS

| | | |
|---|---|---|
| KR | 10-2018-0009014 | 1/2018 |
| KR | 10-2018-0011404 | 2/2018 |

(Continued)

*Primary Examiner* — Bryan R Junge
(74) *Attorney, Agent, or Firm* — KILE PARK REED & HOUTTEMAN PLLC

(57) ABSTRACT

A display device includes a first voltage line disposed on a substrate, a first power supply voltage being applied to the first voltage line, a buffer layer disposed on the first voltage line, a first transistor including a semiconductor pattern disposed on the buffer layer, a first insulating layer disposed on the semiconductor pattern of the first transistor, a first capacitor electrode disposed on the first insulating layer, a second insulating layer disposed on the first capacitor electrode, and a first electrode and a second electrode disposed on the second insulating layer and spaced apart from each other, wherein the second electrode is electrically connected to the first voltage line, and the first voltage line overlaps the first capacitor electrode in a thickness direction of the substrate.

17 Claims, 19 Drawing Sheets

(56) References Cited

U.S. PATENT DOCUMENTS

| | | | |
|---|---|---|---|
| 2017/0125506 A1* | 5/2017 | Kim | H01L 27/124 |
| 2017/0154919 A1* | 6/2017 | Chen | H01L 21/6835 |
| 2018/0261663 A1* | 9/2018 | Li | H01L 21/77 |

FOREIGN PATENT DOCUMENTS

| | | |
|---|---|---|
| KR | 10-1987196 | 6/2019 |
| KR | 10-2019-0075483 | 7/2019 |
| KR | 10-1974700 | 9/2019 |
| KR | 10-2020-0034896 | 4/2020 |

* cited by examiner

T1 : GE1,ACT1,TE1,TE2
T2 : GE2,ACT2,TE3,TE4
T3 : GE3,ACT3,TE5,TE6
CST : CSE1,CSE2,CSE3
CNT1 : CNT11,CNT12,CNT13,
    CNT14,CNT15,CNT16,CNT17
CNT2 : CNT21,CNT22,CNT23,
    CNT24,CNT25,CNT26,CNT27
110 : BML,VDL,VSL
120 : ACT1,ACT2,ACT3
130 : SCL,SSL,SVDL,CSE1,GE1,GE2,GE3
140 : VIL,DTL,CSE2,TE1,TE3,TE4,DP1
150 : CSE3,TE2,TE5,TE6,SVIL,DP2

CNT3 : CNT31,CNT32

DISPLAY DEVICE

CROSS REFERENCE TO RELATED APPLICATION(S)

This application claims priority to and benefits of Korean Patent Application No. 10-2020-0075552 under 35 U.S.C. § 119 filed on Jun. 22, 2020 in the Korean Intellectual Property Office, the entire contents of which are incorporated herein by reference.

BACKGROUND

1. Technical Field

The disclosure relates to a display device.

2. Description of the Related Art

The importance of a display device has increased with the development of multimedia. Accordingly, various types of display devices such as an organic light emitting display (OLED) and a liquid crystal display (LCD) have been implemented.

A display device is a device for displaying an image, and may include a display panel such as a light emitting display panel or a liquid crystal display panel. Among displays, the light emitting display panel may include a light emitting element such as a light emitting diode (LED). Examples of the light emitting diode (LED) may include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure is to provide a display device capable of preventing the alignment of light emitting elements in an undesired area during a manufacturing process by forming a wiring (line) to which a voltage may be applied as a lower conductive layer.

Another aspect of the disclosure is to provide a display device in which a contact hole and an overlying conductive layer are designed not to overlap each other in a thickness direction in order for an insulating layer interposed between a plurality of conductive layers to prevent the generation of a defective insulating layer occurring in an area where a contact hole of a lower conductive layer is formed or disposed, thereby improving reliability.

According to an aspect, there is provided a display device that may include a first voltage line disposed on a substrate, a first power supply voltage being applied to the first voltage line; a buffer layer disposed on the first voltage line; a first transistor including a semiconductor pattern disposed on the buffer layer; a first insulating layer disposed on the semiconductor pattern of the first transistor; a first capacitor electrode disposed on the first insulating layer; a second insulating layer disposed on the first capacitor electrode; and a first electrode and a second electrode disposed on the second insulating layer and spaced apart from each other, wherein the second electrode may be electrically connected to the first voltage line, and the first voltage line may overlap the first capacitor electrode in a thickness direction of the substrate.

In an embodiment, the display device may include a second capacitor electrode disposed on the second insulating layer and overlapping the first capacitor electrode in the thickness direction of the substrate, wherein the first electrode and the second electrode may be disposed on the second capacitor electrode, and the second capacitor electrode may overlap the first voltage line in the thickness direction of the substrate.

In an embodiment, the display device may include a third capacitor electrode disposed on the first insulating layer and overlapping the first capacitor electrode in the thickness of the substrate; and a third insulating layer disposed on the third capacitor electrode, wherein the first capacitor electrode may be disposed on the third insulating layer, and the third capacitor electrode may overlap the first voltage line in the thickness direction of the substrate.

In an embodiment, the third capacitor electrode may overlap the second capacitor electrode in the thickness direction of the substrate, and the second capacitor electrode may be electrically connected to the third capacitor electrode through a contact hole penetrating the second insulating layer and the third insulating layer.

In an embodiment, the first electrode may be electrically connected to the second capacitor electrode.

In an embodiment, the second capacitor electrode may overlap the first electrode in the thickness direction of the substrate, and the second capacitor electrode may be disposed between the first electrode and the first voltage line.

In an embodiment, the display device may include a second voltage line disposed on the substrate, a second power supply voltage being applied to the second voltage line, wherein the buffer layer may be disposed on the second voltage line.

In an embodiment, the second voltage line may overlap the second electrode in the thickness direction of the substrate.

In an embodiment, the first transistor may include a gate electrode disposed on the first insulating layer; and a first electrode disposed on the second insulating layer, wherein the first electrode of the first transistor may be electrically connected to the second voltage line.

In an embodiment, the display device may include a light blocking layer disposed on the substrate, wherein the buffer layer may be disposed on the light blocking layer, and the second capacitor electrode may be electrically connected to the light blocking layer.

In an embodiment, the display device may include a second transistor including a semiconductor pattern disposed on the buffer layer, and a first electrode disposed on the first insulating layer, and a second capacitor electrode disposed on the second insulating layer, wherein the first electrode of the second transistor may be electrically connected to the semiconductor pattern of the second transistor through a first contact hole penetrating the first insulating layer, and the second capacitor electrode may not overlap the first contact hole in the thickness direction of the substrate.

In an embodiment, the display device may include a second transistor including a semiconductor pattern disposed on the buffer layer, a gate electrode of the first transistor disposed on the first insulating layer, a third insulating layer disposed on the gate electrode of the first transistor, wherein the second transistor may include a first electrode disposed on the third insulating layer, the first transistor may include a first electrode disposed on the second insulating layer, the second insulating layer may be disposed on the third insulating layer, the first electrode of the second transistor may be electrically connected to the gate electrode of the first transistor through a first contact hole penetrating the third insulating layer, and the first electrode of the first transistor may not overlap the first contact hole in the thickness direction of the substrate.

In an embodiment, the display device may include a second capacitor electrode disposed on the second insulating layer and overlapping the first capacitor electrode in the thickness direction of the substrate, wherein the second capacitor electrode may not overlap the first contact hole in the thickness direction of the substrate.

In an embodiment, the display device may include a light emitting element disposed on the first electrode and the second electrode, wherein an end of the light emitting element may be electrically connected to the first electrode, and another end of the light emitting element may be electrically connected to the second electrode.

According to another aspect, there is provided a display device that may include a first voltage line disposed on a substrate, a first power supply voltage being applied to the first voltage line; a buffer layer disposed on the first voltage line; a semiconductor layer disposed on the buffer layer and including a semiconductor pattern of a first transistor and a semiconductor pattern of a second transistor; a first insulating layer disposed on the semiconductor layer; a first conductive layer disposed on the first insulating layer and including a gate electrode of the first transistor; a second insulating layer disposed on the first conductive layer; a second conductive layer disposed on the second insulating layer and including a first capacitor electrode and a first electrode of the second transistor; a third insulting layer disposed on the second conductive layer; a third conductive layer disposed on the third insulating layer and including a first electrode of the first transistor, wherein the first electrode of the second transistor may be electrically connected to the gate electrode of the first transistor through a first contact hole penetrating the second insulating layer, and the third conductive layer may not overlap the first contact hole in a thickness direction of the substrate.

In an embodiment, the third conductive layer may include a second capacitor electrode, and the second capacitor electrode may overlap the first capacitor electrode in the thickness direction of the substrate.

In an embodiment, the first electrode of the second transistor may be electrically connected to the semiconductor pattern of the second transistor through a second contact hole penetrating the first insulating layer and the second insulating layer, and the third conductive layer may not overlap the second contact hole in the thickness direction of the substrate.

In an embodiment, the display device may include a fourth insulating layer disposed on the third conductive layer, and a first electrode and a second electrode disposed on the fourth insulating layer and spaced apart from each other, wherein the second electrode may be electrically connected to the first voltage line, and the first voltage line may overlap the first capacitor electrode in the thickness direction of the substrate.

In an embodiment, the first conductive layer may include a third capacitor electrode overlapping the first capacitor electrode in the thickness direction of the substrate, and the third capacitor electrode may be electrically connected to the second capacitor electrode.

In an embodiment, display device may include a second voltage line disposed on the substrate, a second power supply voltage being applied to the second voltage line, wherein the buffer layer may be disposed on the second voltage line.

However, aspects of the disclosure are not restricted to the one set forth herein. The above and other aspects of the disclosure will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
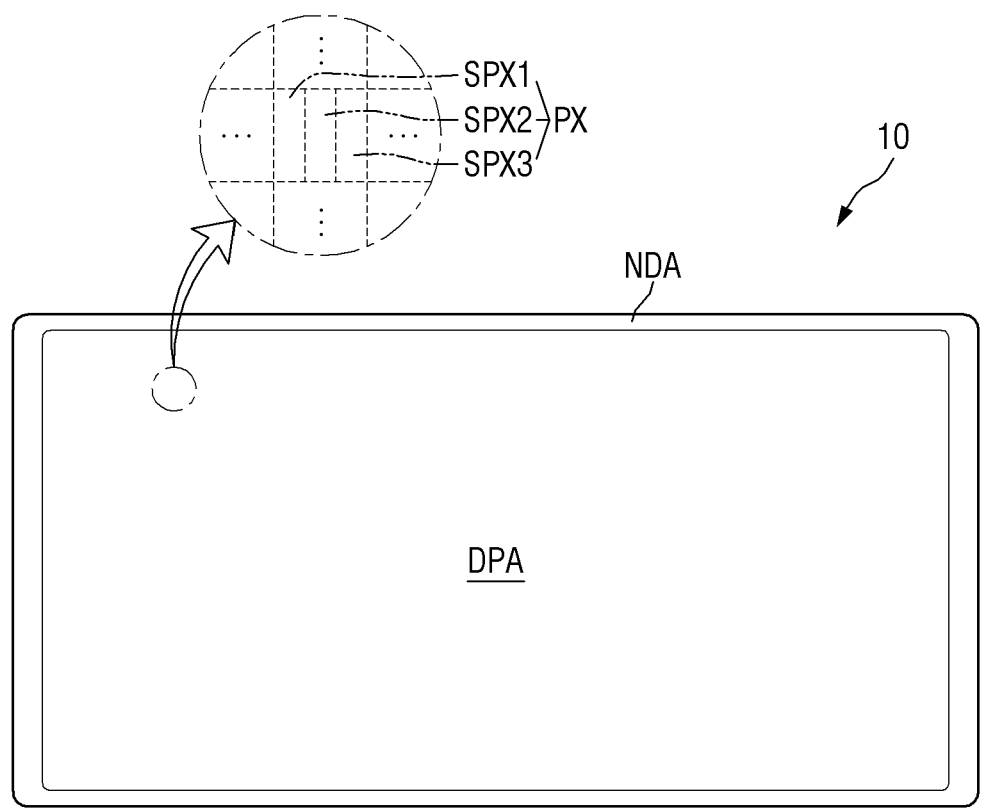
FIG. 1 is a schematic plan view of a display device according to an embodiment.
Figure 1:
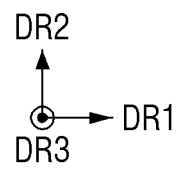

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As used herein, the singular forms "a," "an," and "the" are intended to include the plural forms as well, unless the context clearly indicates otherwise.

It will be further understood that the terms "comprises" and/or "comprising" "includes" and/or "including" and "have" and/or "having" and their variations thereof as used herein specify the presence of stated features or elements, but do not preclude the presence or addition of one or more other features or elements.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the disclosure will be described with reference to the attached drawings.

FIG. 1 is a schematic plan view of a display device according to an embodiment.

Referring to FIG. 1, a display device 10 displays a mobile image or a still image. The display device 1 may refer to any electronic device that provides a display screen. Examples of the display device 1 may include televisions, notebook computers, monitors, billboards, things of internet (IoTs), mobile phones, smart phones, tablet personal computers (tablet PCs), electronic watches, smart watches, watch phones, mobile communication terminals, electronic notebooks, electronic books, portable multimedia players (PMPs), navigators, game machines, digital cameras, and camcorders.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel may be used as the display panel will be described as an example, but the disclosure is not limited thereto. Other display panels may be applied within the spirit and the scope of the disclosure.

In the drawings, a first direction DR1, a second direction DR2, and a third direction DR3 are illustrated. The first direction DR1 and the second direction DR2 may be directions perpendicular to each other in a plane. The third direction DR3 may be a direction perpendicular to the plane in which the first direction DR1 and the second direction DR2 may be located. The third direction DR3 may be perpendicular to each of the first direction DR1 and the second direction DR2. In embodiments explaining the display device 10, the third direction DR3 represents a thickness direction of the display device 10.

The display device 10 may have a substantially rectangular shape in which the first direction DR1 may be longer than the second direction DR2 in a plan view. In a plan view, the corner of the display device 10 where the long side meets the short side may be substantially right-angled, but is not limited thereto, and may have a substantially rounded curved shape. The shape of the display device 10 is not limited to those exemplified, and may be variously changed. For example, the display device 10 may have a shape such as substantially a square, a rectangle having rounded corners (vertexes), a polygon, or a circle in a plan view.

The display surface of the display device 10 may be disposed at one or a side of the third direction DR3 which is a thickness direction. In the description of the display device 10, unless otherwise stated in the embodiments, the "upper" refers to a display direction toward one or a side in the third direction (DR3), likewise the "upper surface" refers to a surface facing one or a side in the third direction (DR3). The "lower" refers to a direction opposite to the display direction toward the other side in the third direction (DR3), and the "lower surface" refers to a surface facing the other side in the third direction (DR3). Further, the "left", "right", "upper", and "lower" refer to directions in a case that the display panel 300 is viewed on the plane. For example, the "left" refers to a direction opposite to the first direction (DR1), the "right" refers to the first direction (DR1), the "upper" refers to the second direction (DR2), and the "lower" refers to a direction opposite to the second direction (DR2).

The display device 10 may include a display area DPA and a non-display area NDA. The display area DPA may be an area where an image may be displayed, and the non-display area NDA may be an area where an image may not be displayed. The display area DPA may be referred to as an active area, and the non-display area NDA may be referred to as an inactive area.

The shape of the display area DPA may follow the shape of the display device 10. For example, the display area DPA may have a substantially planar rectangular shape similar to the overall shape of the display device 10. The display area DPA may generally occupy the center of the display device 10.

The display area DPA may include a plurality of pixels PX. The plurality of pixels PX may be arranged or disposed in a matrix direction. The shape of each of the pixels PX may be substantially rectangular or substantially square in a plan view, but is not limited thereto. Each of the pixels PX may also have a substantially rhombus shape, each side thereof being inclined with respect to one direction. The respective pixels PX may be alternately arranged or disposed in a stripe type or a pentile type. Each of the pixels PX may include at least one light emitting element ED (refer to FIG. 2) that may emit light of a specific wavelength band.

Each of the plurality of pixels PX may include a plurality of sub-pixels (SPX: SPX1, SPX2, SPX3). In an embodiment, each of the pixels PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be blue, the second color may be green, and the third color may be red. However, the disclosure is not limited thereto, and the sub-pixels SPX may emit light of the same color. Although it is shown in the drawings that the first to third sub-pixels SPX1, SPX2, and SPX3 may be arranged or disposed in a stripe type, the arrangement of the first to third sub-pixels SPX1, SPX2, and SPX3 is not limited thereto, and may have various arrangement structures.

The non-display area NDA may be disposed around the display area DPA. The non-display area NDA may entirely or partially surround or may be adjacent to the display area DPA. In an embodiment, the display area DPA may have a substantially rectangular shape, and the non-display area NDA may be disposed adjacent to four sides of the display area DPA. The non-display area NDA may constitute a bezel of the display device 10. The non-display area DPA may be provided with lines, circuit drivers, or a pad unit on which an external device may be mounted.

Figure 2:
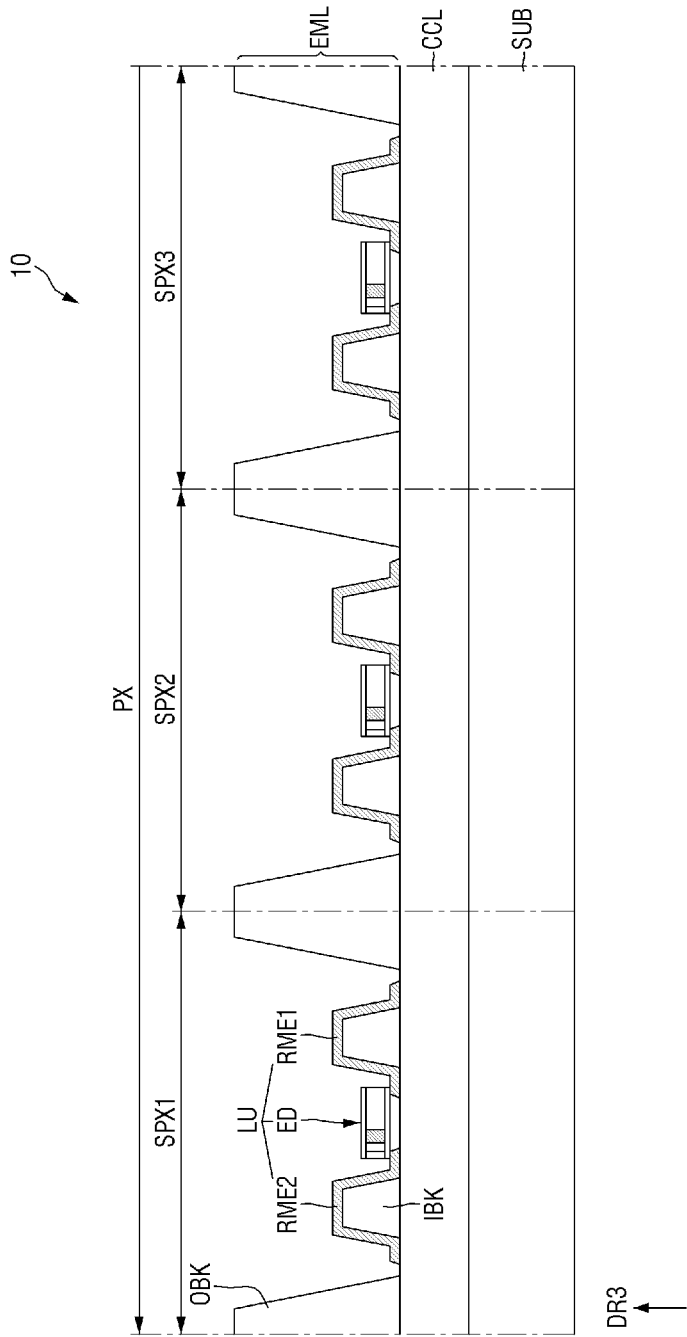
FIG. 2 is a schematic cross-sectional view of a display device according to an embodiment.

FIG. 2 is a schematic cross-sectional view of a display device according to an embodiment.

Referring to FIG. 2, the display device 10 may include a substrate SUB, a circuit element layer CCL disposed on the substrate SUB, and a light emitting element layer EML disposed on the circuit element layer CCL.

The substrate SUB may be an insulating substrate. The substrate SUB may include a transparent material. For example, the substrate SUB1 may include an insulating material such as glass, quartz, or polymer resin. The substrate SUB may be a rigid substrate, but may also be a flexible substrate capable of bending, folding, rolling, and the like within the spirit and the scope of the disclosure.

The circuit element layer CCL driving the sub-pixel SPX may be disposed on the substrate SUB. The circuit element layer CCL may be disposed between the light emitting element layer EML and the substrate SUB. Details of the circuit element layer CCL will be described later.

The light emitting element layer EML may be disposed on the circuit element layer CCL. The light emitting element layer EML may include a light emitting element ED, a first electrode RME1, a second electrode RME2, a first bank OBK, and a second bank IBK.

The first bank OBK may be disposed on one surface of the substrate SUB along the boundary of each of the sub-pixels SPX1, SPX2, and SPX3. The first bank OBK may be disposed on the circuit element layer CCL, and may include an opening exposing the second bank IBK and the plurality of light emitting elements ED to be described later. A light emitting area and a non-light emitting area may be divided by the first bank OBK and the opening thereof.

The first bank OBK may be disposed at the boundary of the sub-pixels SPX to distinguish neighboring sub-pixels SPX. The first bank OBK may be disposed across the boundary of the neighboring sub-pixels SPX. The first bank OBK may serve to prevent ink from overflowing to the adjacent sub-pixels SPX in an inkjet printing process using ink in which a plurality of light emitting elements ED may be arranged or disposed. Further, in a case that each sub-pixel SPX may include a different light emitting element ED, the first bank OBK may serve to separate inks in which different light emitting elements ED may be dispersed such that they may not be mixed with each other.

The second bank IBK, the first and second electrodes RME1 and RME2, and the plurality of light emitting elements ED may be arranged or disposed in the opening of the first bank OBK.

The second bank IBK may be disposed on the circuit element layer CCL exposed by the first bank OBK. A plurality of second banks IKB may be arranged or disposed in each sub-pixel SPX, and the second banks IBK may be spaced apart from each other. In an embodiment, two second banks IBK may be arranged or disposed, and may be spaced apart from each other.

Each of the first electrode RME1 and the second electrode RME2 may be disposed on the second bank IBK to cover or overlap the second bank IBK. The first electrode RME1 and the second electrode RME2 may be electrically insulated from each other.

The light emitting element ED may be disposed between the first electrode RME1 and the second electrode RME2. For example, the light emitting element ED may be disposed between the first electrode RME1 and the second electrode RME2 disposed on the second banks IBK and spaced apart from each other.

One or an end of the light emitting element ED may be electrically connected to the first electrode RME1, and the other or another end of the light emitting element ED may be electrically connected to the second electrode RME2. The light emitting element ED may be an inorganic light emitting diode made of an inorganic material. Details of the light emitting element ED will be described later. The first electrode RME1, the light emitting element ED, and the second electrode RME2 may constitute a light source unit LU (refer to FIG. 4).

Figure 3:
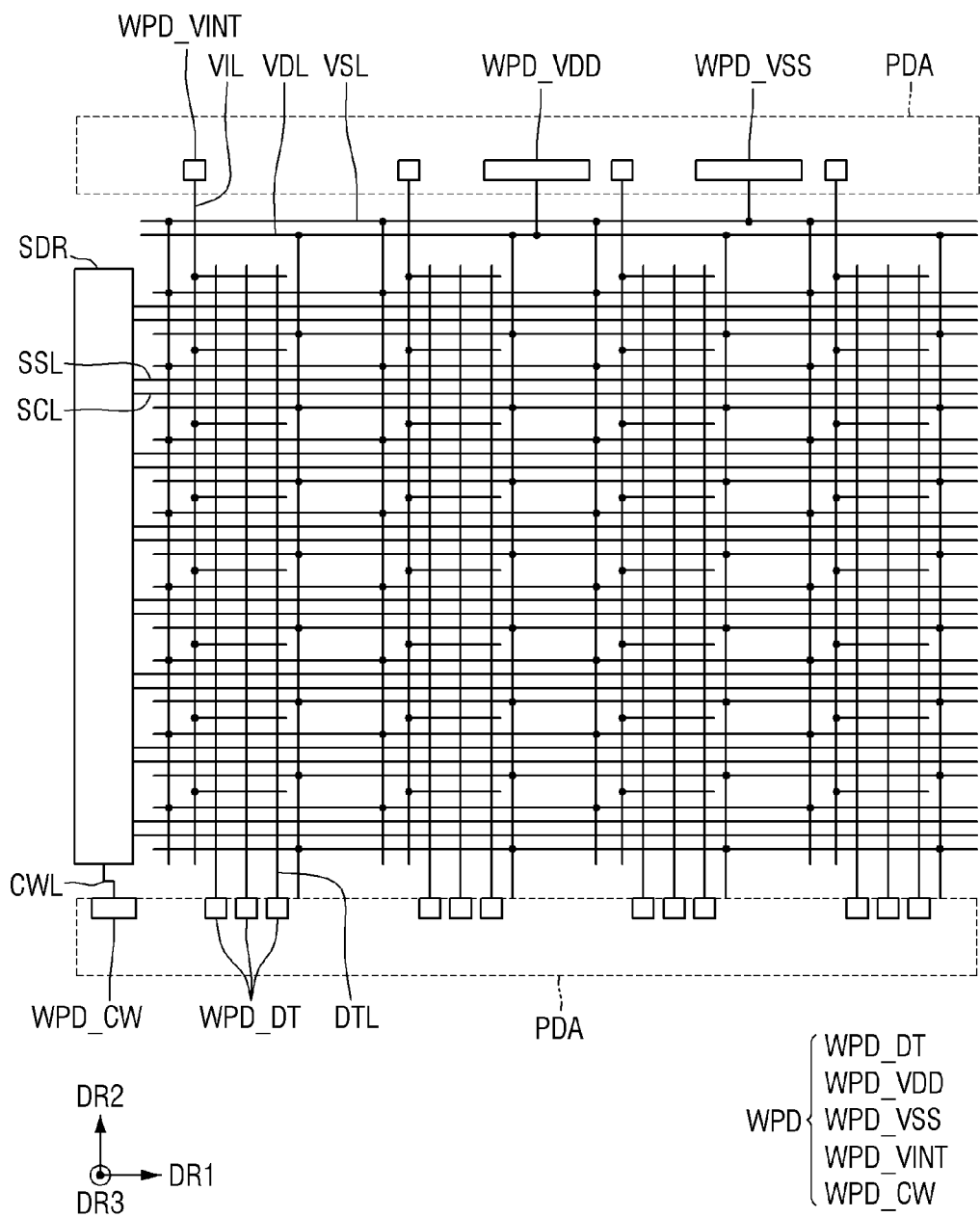
FIG. 3 is a schematic layout view of a circuit element layer of a display device according to an embodiment.

FIG. 3 is a schematic layout view of a circuit element layer of a display device according to an embodiment.

Hereinafter, the circuit element layer CCL of the display device 10 will be described in detail.

Referring to FIG. 3, the display device 10 may include a plurality of lines arranged or disposed on the substrate SUB. The plurality of lines may include a scan line (SCL), a sensing line (SSL), a data line (DTL), an initialization voltage line (VIL), a first voltage line (VDL), and a second voltage line (VSL). Although not shown in the drawing, the display device 10 may be provided with other lines.

Meanwhile, as used herein, the 'connection' may mean that not only any one member is connected to another member through physical contact with each other, but also connected to another member through still another member. Further, it may be understood that one portion and the other portion of one integral member may be connected to each other. Moreover, it may be interpreted that the connection between any one member and another member may include direct contact connection and electrical connection through still another member.

The scan line SCL and the sensing line SSL may extend in the first direction DR1. The scan line SCL and the sensing line SSL may be electrically connected to a scan driver SDR. The scan driver SDR may include a driving circuit. The scan driver SDR may be disposed in the non-display area NDA. In an embodiment, the scan driver SDR may be disposed in the non-display area NDA adjacent to the first short side (left side in FIG. 1) of the display device 10, but the disclosure is not limited thereto, and the scan driver SDR may also be disposed in the non-display area NDA adjacent to the second short side (right side in FIG. 1) of the display device 10. The scan driver SDR may be electrically connected to a signal connection line CWL, and at least one or an end of the signal connection line CWL may be electrically connected to an external device by forming a wiring pad WPD_CW (hereinafter referred to as a "signal connection pad") on the non-display area NDA.

The data line DTL and the initialization voltage line VIL may extend in the second direction DR2 crossing or intersecting the first direction DR1. The initialization voltage line VIL may further include a portion branched in the first direction DR1 for example to the portion extending in the second direction DR2.

The first voltage line VDL and the second voltage line VSL may extend in the second direction DR2. Each of the first voltage line VDL and the second voltage line VSL may further include a portion extending in the first direction DR1. The portion extending in the first direction DR1 and the portion extending in the second direction DR2 of the first voltage line VDL and the second voltage line VSL may be formed of conductive layers disposed on different layers. Each of the first voltage line VDL and the second voltage line VSL may have a mesh structure, but the structure thereof is not limited thereto.

The data line DTL, the initialization voltage line VIL, the first voltage line VDL, and the second voltage line VSL may be electrically connected to at least one wiring pad WPD. Each wiring pad WPD may be disposed in a pad area PDA included in the non-display area NDA. The pad areas PDA may be disposed in the non-display area NDA adjacent to the first long side (upper side in FIG. 1) of the display device 10 and the non-display area NDA disposed adjacent to the second long side (lower side in FIG. 1) of the display device 10.

In one embodiment, the wiring pad (WPD_DT, hereinafter referred to as "data pad") of the data line DTL may be disposed in the underlying pad area PDA, and the wiring pad (WPD_VINT, hereinafter referred to as 'initialization voltage pad') of the initialization voltage line VIL, the wiring pad VDL (WPD_VDD, hereinafter referred to as "first voltage pad") of the first voltage line, and the wiring pad (WPD_VSS, hereinafter referred to as "second voltage pad") of second voltage line VSL may be disposed in the overlying pad area PDA. As another example, the data pad WPD_DT, the initialization voltage pad WPD_VINT, the first voltage pad WPD_VDD, and the second voltage pad WPD_VSS may all be disposed in the same area, for example, the overlying pad area PDA. An external device may be mounted on the wiring pad WPD. The external device may be mounted on the wiring pad WPD through an anisotropic conductive film, ultrasonic bonding, or the like within the spirit and the scope of the disclosure.

Each pixel PX or each sub-pixel SPX of the display device 10 may include a pixel driving circuit. The above-described lines may apply a driving signal to each pixel driving circuit while passing through each pixel PX or a periphery thereof. The pixel driving circuit may include a transistor and a capacitor. The number of transistors and capacitors in each pixel driving circuit may be variously changed. Each sub-pixel SPX of the display device 10 according to an embodiment may have a 3T1C structure in which a pixel driving circuit may include three transistors and one capacitor. Hereinafter, a case where the pixel driving circuit included in the display device 10 has a 3T1C structure will be described as an example, but the disclosure is not limited thereto, and various other modified pixel structures such as a 2T1C structure, a 7T1C structure, and a 6T1C structure may also be applied.

Figure 4:
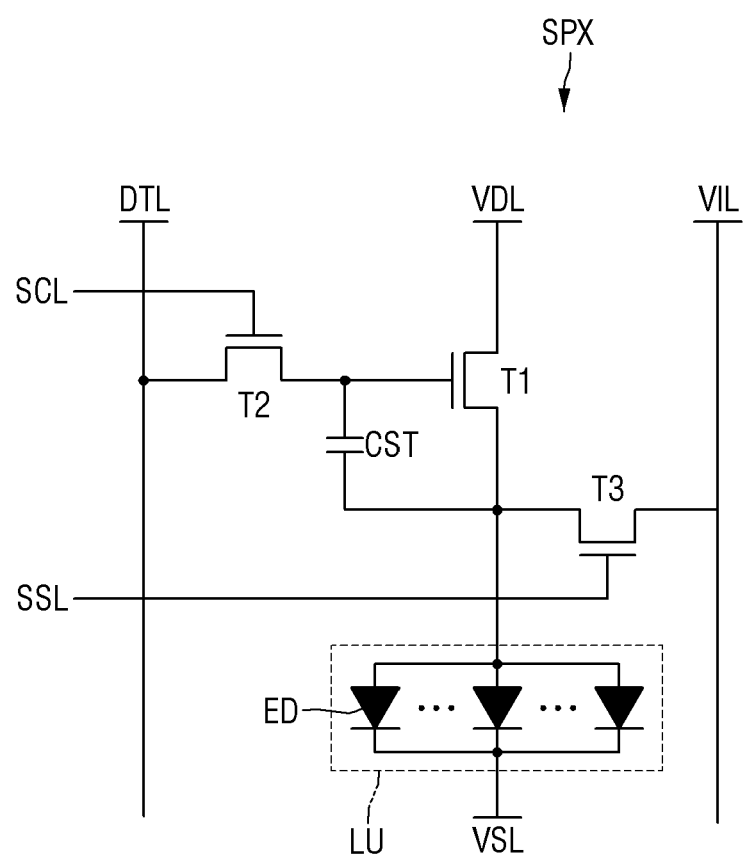
FIG. 4 is an equivalent circuit diagram of one sub-pixel of a display device according to an embodiment.

FIG. 4 is an equivalent circuit diagram of one sub-pixel of a display device according to an embodiment.

Referring to FIG. 4, each sub-pixel SPX of the display device 10 according to an embodiment may include a light source unit LU, a plurality of transistors T1, T2, and T3, and a capacitor CST. The plurality of transistors T1, T2, and T3 may include a first transistor T1, a second transistor T2, and a third transistor T3.

The light source unit LU emits light according to a current supplied through the first transistor T1. The light source unit LU may include a first electrode, a second electrode, and a plurality of light emitting elements ED arranged or disposed between the first electrode and the second electrode and electrically connected in parallel to each other. The light emitting element ED may emit light of a specific wavelength band by electric signals transmitted from the first electrode and the second electrode.

Meanwhile, although it is shown in the drawing that the plurality of light emitting elements ED included in the light source unit (LU) may be arranged or disposed in the same direction and electrically connected in parallel to each other, the disclosure is not limited thereto. For example, some or a predetermined number of the plurality of light emitting elements ED and others thereof may be arranged or disposed in opposite directions to each other.

One or an end of the light source unit LU may be electrically connected to a source electrode of the first transistor T1, and the other or another end thereof may be electrically connected to the second voltage line VSL to which a low-potential voltage (hereinafter, a second power voltage) lower than a high-potential voltage (hereinafter, a first power voltage) of the first voltage line VDL may be supplied. For example, one or an end of the light emitting element ED included in the light source unit LU may be electrically connected to the source electrode of the first transistor T1 through a first electrode of the light source unit LU, and the other or another end of the light emitting element ED may be electrically connected to the second voltage line VSL through a second electrode of the light source unit LU.

The first transistor T1 adjusts a current flowing from the first voltage line VDL, to which the first power voltage may be supplied, to the light source unit LU according to a difference in voltage between a gate electrode and a source electrode. For example, the first transistor T1 may be a driving transistor for driving the light source unit LU. The gate electrode of the first transistor T1 may be electrically connected to the second source/drain electrode of the second transistor T2, the source electrode of the first transistor T1 may be electrically connected to the first electrode of the light source unit LU, and the drain electrode of the first transistor T1 may be electrically connected to the first voltage line VDL to which the first power voltage may be applied.

The second transistor T2 may be turned on by a scan signal of the scan line SCL to electrically connect the data line DTL to the gate electrode of the first transistor T1. The gate electrode of the second transistor T2 may be electrically connected to the scan line SCL, the second source/drain electrode of the second transistor T2 may be electrically connected to the gate electrode of the first transistor T1, and the first source/drain electrode of the second transistor T2 may be electrically connected to the data line DTL.

The third transistor T3 may be turned on by a sensing signal of the sensing line SSL to electrically connect the initialization voltage line VIL to the source electrode of the first transistor T1. The gate electrode of the third transistor T3 may be electrically connected to the sensing line SSL, and the first source/drain electrode of the third transistor T3 may be electrically connected to the initialization voltage line VIL, and the second source/drain electrode of the third transistor T3 may be electrically connected to the source electrode of the first transistor T1.

In an embodiment, the first source/drain electrode of each of the second and third transistors T2 and T3 may be a source electrode, and the second source/drain electrode thereof may be a drain electrode, but the disclosure is not limited thereto, and vice versa.

The capacitor CST may be formed or disposed between the gate electrode of the first transistor T1 and the source electrode of the first transistor T1. The capacitor CST stores a difference voltage between the gate voltage and source voltage of the first transistor T1.

Each of the first to third transistors T1, T2, and T3 may be formed as a thin film transistor. Although it is shown in FIG. 3 that the first to third transistors T1, T2, and T3 may be formed as N-type MOSFETs (Metal Oxide Semiconductor Field Effect Transistors), the disclosure is not limited thereto. For example, the first to third transistors T1, T2, and T3 may be formed as P-type MOSFETs, or some or a predetermined number of the first to third transistors T1, T2, and T3 may be formed as N-type MOSFETs and others thereof may be formed as P-type MOSFETs.

Figure 5:
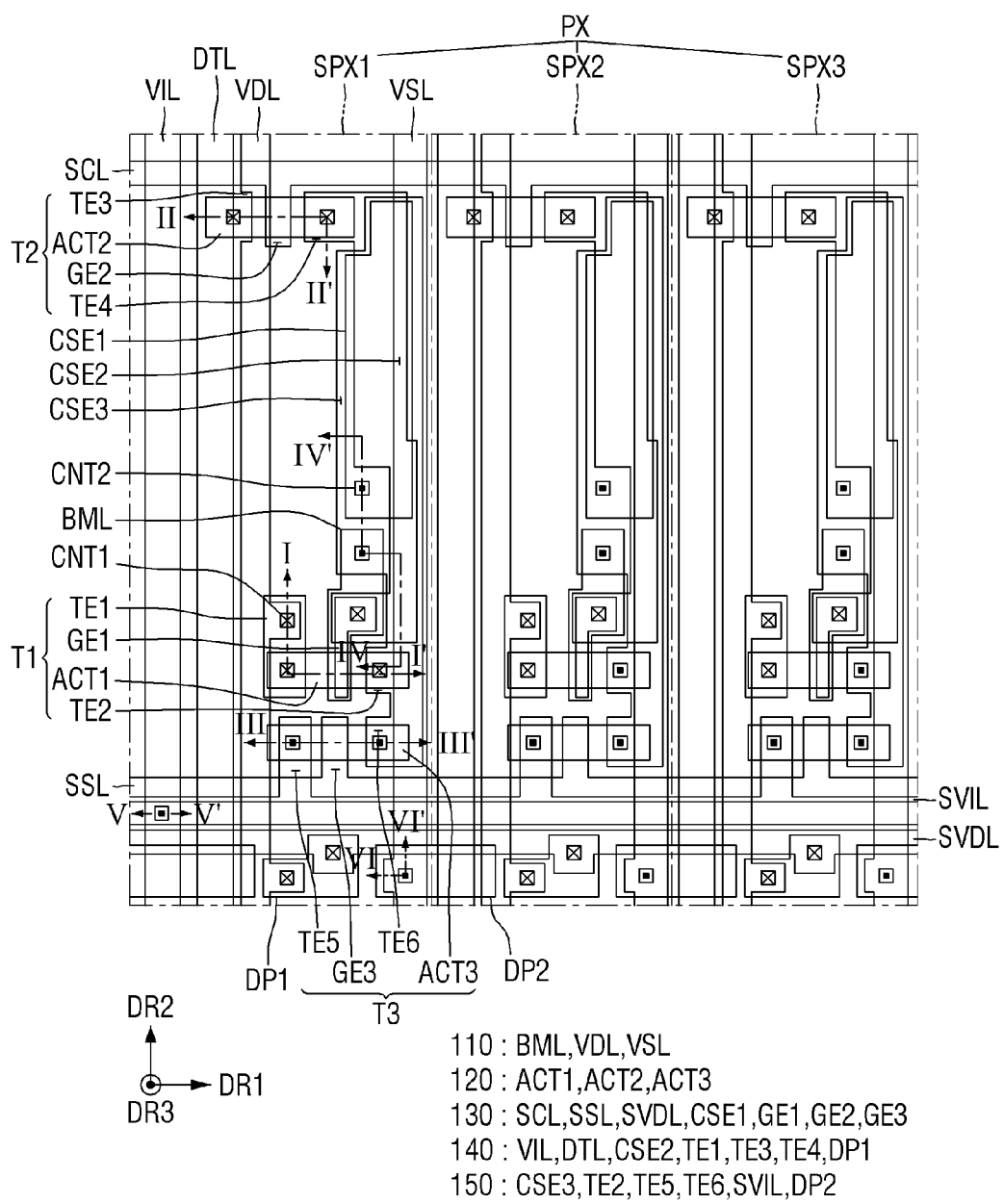
FIG. 5 is a layout view illustrating a plurality of conductive layers and a plurality of semiconductor layers arranged or disposed in one pixel of a circuit element layer according to an embodiment.
Figure 6:
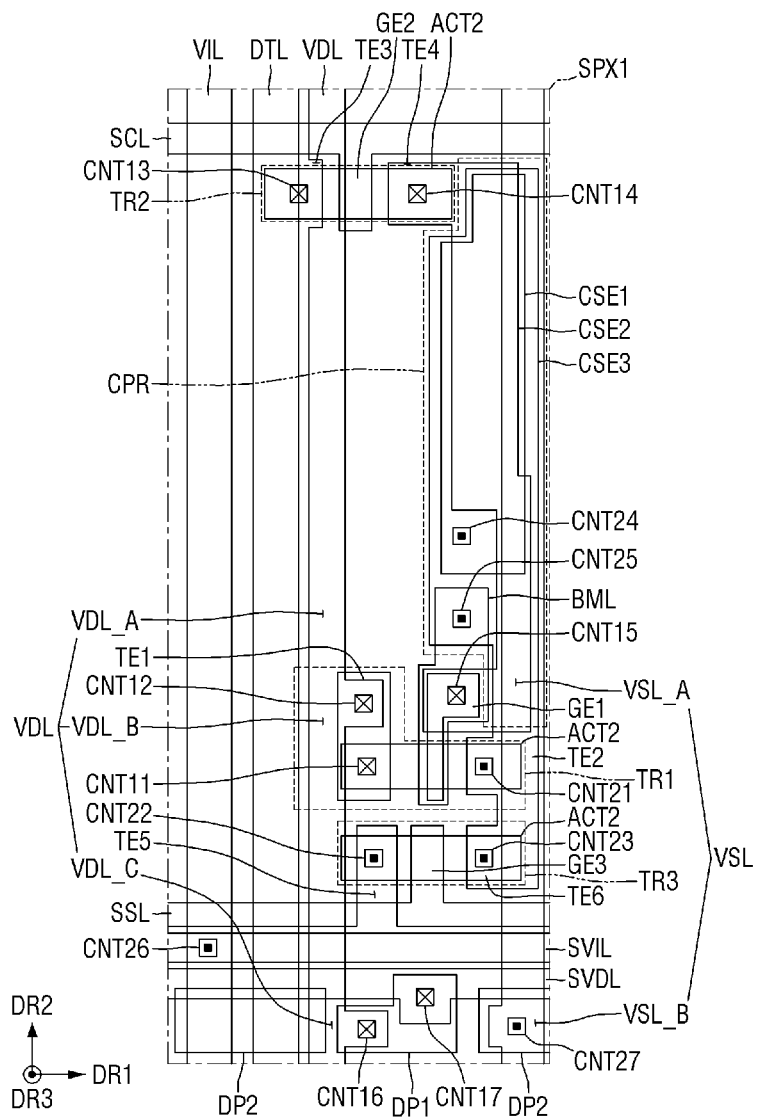
FIG. 6 is a layout view illustrating a plurality of conductive layers and a plurality of semiconductor layers arranged or disposed in one pixel of the circuit element layer of FIG. 5.
Figure 7:
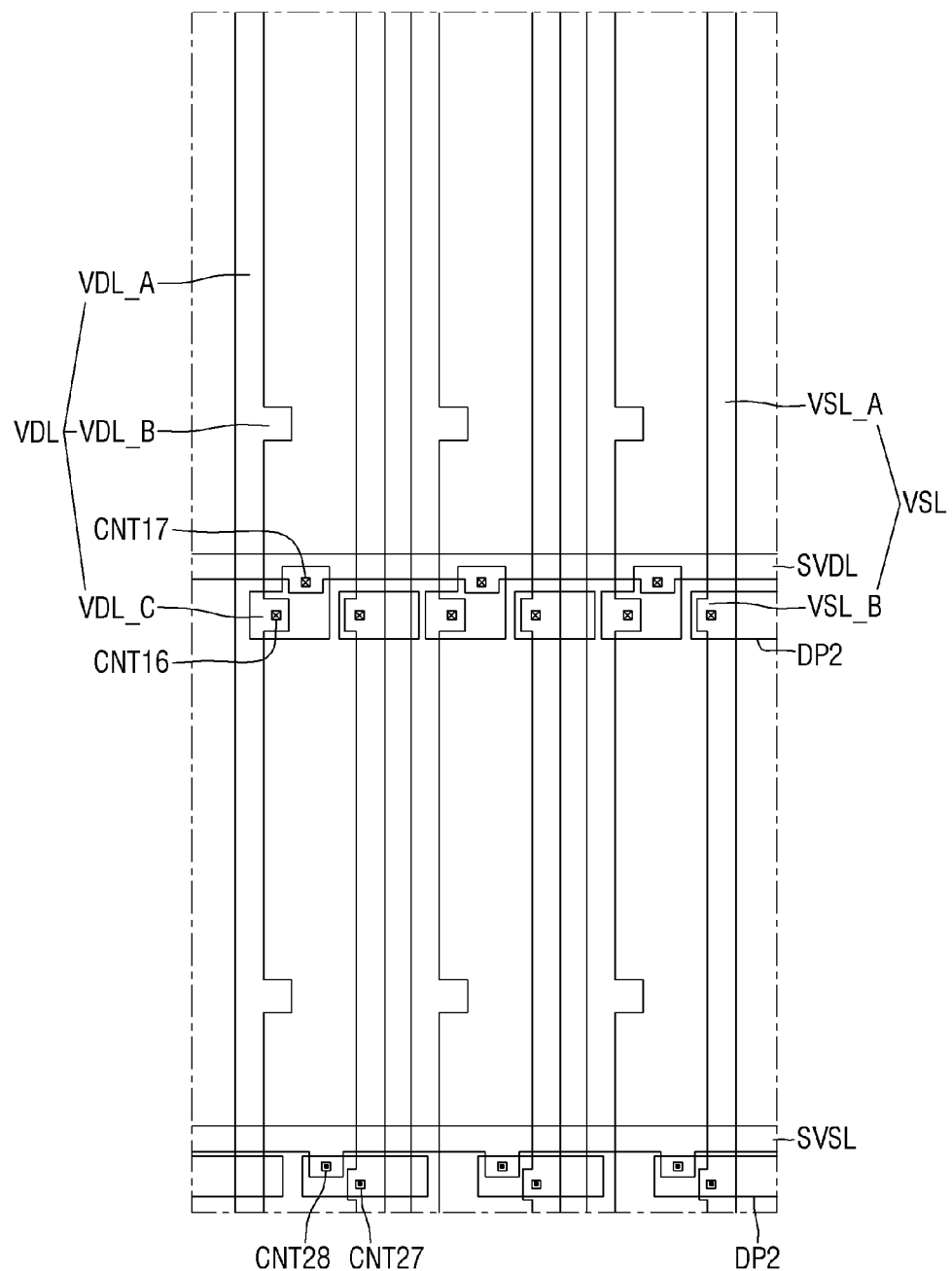
FIG. 7 is a layout view illustrating a connection relationship among a first voltage line, a second voltage line, a first voltage auxiliary line, and a second voltage auxiliary line of a circuit element layer according to an embodiment.
Figure 8:
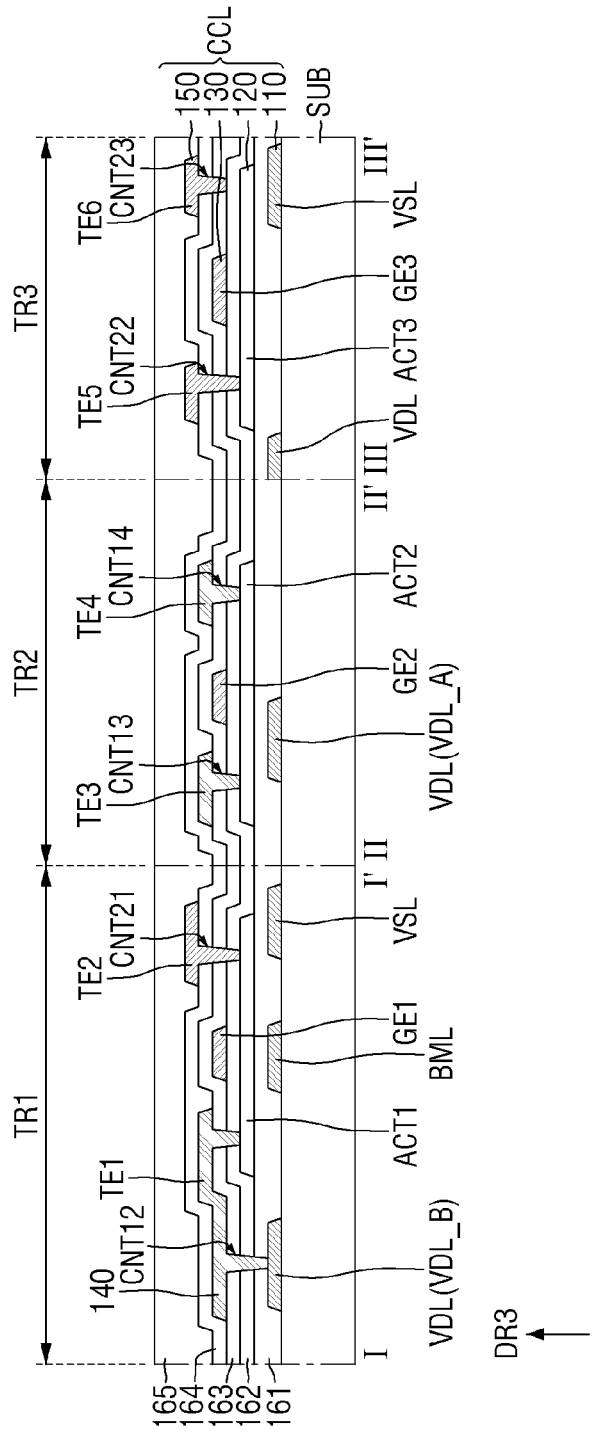
FIG. 8 is a schematic cross-sectional view taken along the lines I-I', II-II', and III-III' of FIG. 5.
Figure 9:
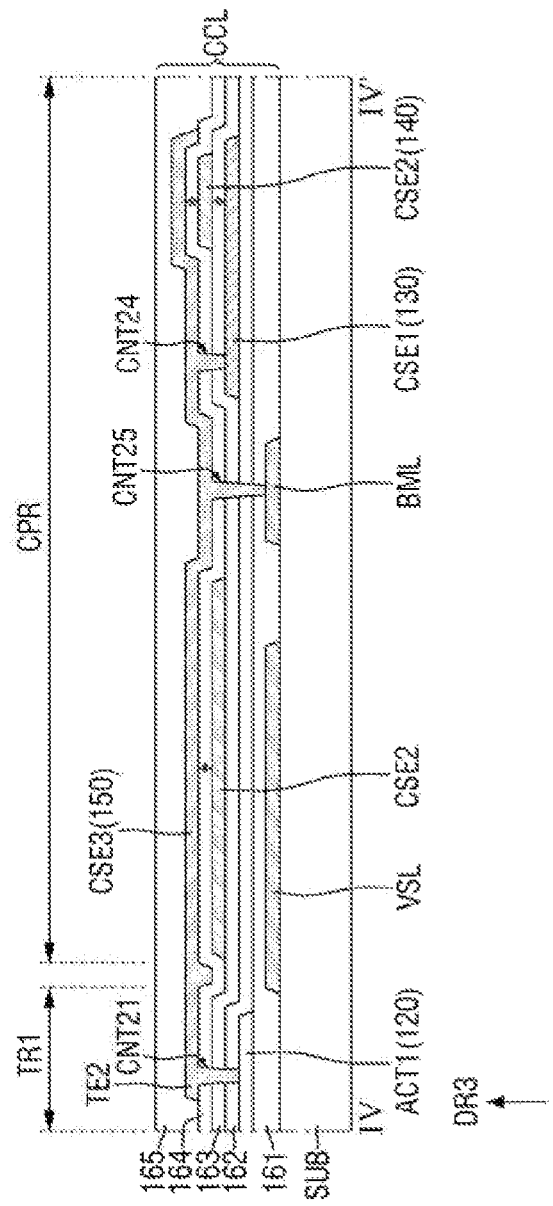
FIG. 9 is a schematic cross-sectional view taken along the line IV-IV' of FIG. 5.
Figure 10:
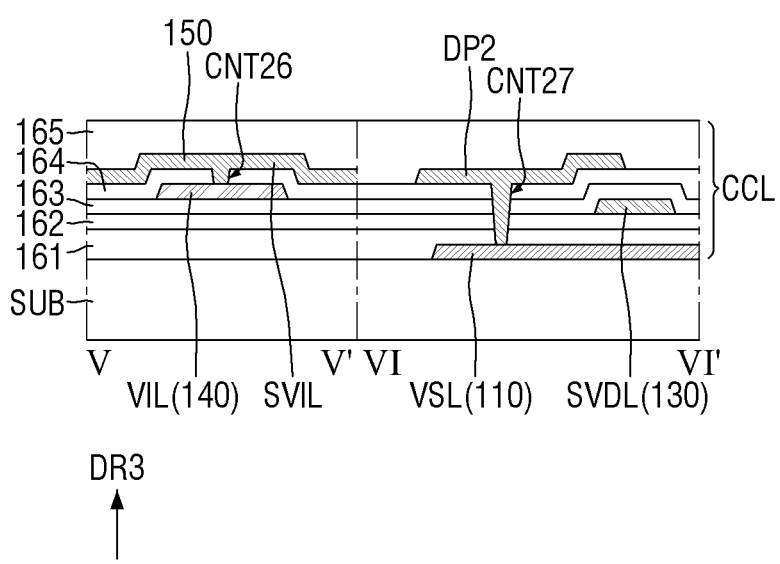
FIG. 10 is a schematic cross-sectional view taken along the lines V-V' and VI-VI' of FIG. 5.

FIG. 5 is a layout view illustrating a plurality of conductive layers and a plurality of semiconductor layers arranged or disposed in one pixel of a circuit element layer according to an embodiment. FIG. 6 is a layout view illustrating a plurality of conductive layers and a plurality of semiconductor layers arranged or disposed in one pixel of the circuit element layer of FIG. 5. FIG. 7 is a layout view illustrating a connection relationship among a first voltage line, a second voltage line, a first voltage auxiliary line, and a second voltage auxiliary line of a circuit element layer according to an embodiment. FIG. 8 is a schematic cross-sectional view taken along the lines I-I', II-II', and III-III' of FIG. 5. FIG. 9 is a schematic cross-sectional view taken along the line IV-IV' of FIG. 5. FIG. 10 is a schematic cross-sectional view taken along the lines V-V' and VI-VI' of FIG. 5.

FIG. 8 shows the cross-sections of the first transistor region TR1, the second transistor region TR2, and the third transistor region TR3 of FIG. 5 together. FIG. 9 shows the cross-sections of a part of the first transistor region TR1 and a part of the capacitor region CPR of FIG. 5 together. FIG. 10 shows the cross-sections for the connection relationship between the initialization voltage line VIL and the initialization voltage auxiliary line SVIL and the connection relationship between the second voltage line VSL and the second conductive pattern DP2 of the fourth conductive layer 150 in FIG. 5 together.

Hereinafter, a plurality of layers disposed on the circuit element layer CCL of the display device 10 will be described with reference to FIGS. 5 to 10.

As described above, each pixel PX of the display device 10 may include first to third sub-pixels SPX1, SPX2, and SPX3. The sub-pixels SPX1, SPX2, and SPX3 may be repeatedly arranged or disposed in order of the first sub-pixel SPX1, the second sub-pixel SPX2, and the third sub-pixel SPX3 along the first direction DR1.

Referring to FIGS. 5 to 10, each of the transistors T1, T2, and T3 may include a conductive layer forming an electrode, a semiconductor layer 120 forming a semiconductor pattern, and an insulating layer. The capacitor CST may include conductive layers forming an electrode and an insulating layer disposed between the conductive layers. The above-described conductive layer, semiconductor layer 120 and insulating layer may be disposed on the substrate SUB. For example, the first transistor T1 may include a first semiconductor pattern ACT1, a first gate electrode GE1, a first transistor second electrode TE1, and a first transistor first electrode TE2. The second transistor T2 may include a second semiconductor pattern ACT2, a second gate electrode GE2, a second transistor second electrode TE3, and a second transistor first electrode TE4. The third transistor T3 may include a third semiconductor pattern ACT3, a third gate electrode GE3, a third transistor first electrode TE5 and a third transistor second electrode TE6.

The circuit element layer CCL of the display device 10 according to an embodiment may include a plurality of conductive layers, a semiconductor layer 120, and a plurality of insulating layers, which may be arranged or disposed on the substrate SUB. The plurality of conductive layers may include a first conductive layer 110, a second conductive layer 130, a third conductive layer 140, and a fourth conductive layer 150. The plurality of insulating layers may include a gate insulating layer 162, a first interlayer insulating layer 163, a passivation layer 164, and a second interlayer insulating layer 165. The respective layers of the circuit element layer CCL may be arranged or disposed on the substrate SUB in order of the first conductive layer 110, a buffer layer 161, the semiconductor layer 120, the gate insulating layer 162, the second conductive layer 130, the first interlayer insulating layer 163, the third conductive layer 140, the passivation layer 164, the fourth conductive layer 150, and the second interlayer insulating layer 165. Each of the above-described layers may be formed of a single film, but may also be formed of a laminated film including a plurality of films. Another layer may be further disposed between the respective layers. Although it is shown in the drawings that the second interlayer insulating layer 165 may be disposed on the fourth conductive layer 150, the disclosure is not limited thereto. In some cases, the second interlayer insulating layer 165 may be omitted, and the second bank IBK of the light emitting element layer EML to be described later may be directly disposed on the fourth conductive layer 150.

The first conductive layer 110 may be disposed on the substrate SUB. The first conductive layer 110 may include a first voltage line VDL, a second voltage line VSL, and a light blocking layer BML. The first voltage line VDL may correspond to a portion extending in the second direction DR2 of the first voltage line VDL shown in FIG. 3. Similarly, the second voltage line VSL may correspond to a portion extending in the second direction DR2 of the second voltage line VSL shown in FIG. 3.

The first voltage line VDL may be disposed at the left side of each of the sub-pixels SPX1, SPX2, and SPX3 in a plan view. The first voltage line VDL may extend in the second direction DR2. The first voltage line VDL may extend to another sub-pixel SPX neighboring in or adjacent to the second direction DR2.

The first voltage line VDL may include an extension portion VDL_A and a first contact portion VDL_B and a second contact portion VDL_C protruding from the extension portion VDL_A. The width of the first contact portion VDL_B and the second contact portion VDL_C of the first voltage line VDL in the first direction DR1 may be larger than the width of the extension portion VDL_A of the first voltage line VDL in the first direction DR1. The first voltage line VDL may be generally formed as the extension portion VDL_A, but may be formed as the first and second contact portions VDL_B and VDL_C in an area electrically connected to the third conductive layer 140 through first contact holes CNT12 and CNT16 to be described later.

The first voltage line VDL may pass through the first transistor region TR1. For example, the first protrusion portion VDL_B of the first voltage line VDL may overlap at least a part of the first transistor region TR1 in the third direction DR3. The first protrusion portion VDL_B of the first voltage line VDL may overlap at least a part of the first transistor second electrode TE1 of the third conductive layer 140, which will be described later, in the third direction DR3. The first voltage line VDL may be electrically connected to the overlying first transistor second electrode TE1 through a first contact hole CNT12.

The second voltage line VSL may be disposed to be spaced apart from the first voltage line VDL at the right side of the first voltage line VDL in a plan view. The second voltage line VSL may be disposed at the right side of each of the sub-pixels SPX1, SPX2, and SPX3 in a plan view. The second voltage line VSL may extend in the second direction DR2. The second voltage line VSL may extend to another sub-pixel SPX neighboring in or adjacent to the second direction DR2.

The second voltage line VSL may include an extension portion VSL_A and a contact portion VSL_B protruding from the extension portion VSL_A. The width of the contact portion VSL_B of the second voltage line VSL in the first direction DR1 may be greater than the width of the extension portion VSL_A of the second voltage line VSL in the first direction DR1. The second voltage line VSL may be generally formed as an extension portion VSL1_A, but may be formed as the contact portion VSL_B in an area electrically connected to the fourth conductive layer 150 through a second contact hole CNT27 to be described later.

The second voltage line VSL may pass through the capacitor region CPR. For example, the second voltage line VSL may overlap a part of the capacitor region CPR in the third direction DR3. However, the disclosure is not limited thereto, and the second voltage line VSL may not overlap the capacitor region CPR in the third direction DR3.

The light blocking layer BML may be disposed between the first voltage line VDL and the second voltage line VSL in a plan view. The light blocking layer BML may be generally disposed at the center of each sub-pixel SPX. For example, the light blocking layer BML may be disposed to be spaced apart from the first voltage line VDL and the second voltage line VSL at the right side of the first voltage line VDL and the left side of the second voltage line VSL in a plan view. The light blocking layer BML may have a substantially rectangular shape protruding from the upper right side thereof to the upper side thereof (or the second direction DR2) and protruding from the lower left side thereof to the lower side there of (or a direction opposite to the second direction DR2), but the disclosure is not limited thereto.

The light blocking layer BML may serve to protect the first semiconductor pattern ACT1 of the first transistor T1 from external light. The light blocking layer BML may pass through the first transistor region TR1 and the capacitor region CPR. The light blocking layer BML may overlap a part of the first transistor region TR1 and at least a part of the capacitor region CPR in the third direction DR3.

The light blocking layer BML may overlap at least a part of the third capacitor electrode CSE3 of the fourth conductive layer 150, which will be described later, in the capacitor region CPR in the third direction DR3. The light blocking layer BML may be electrically connected to the overlying third capacitor electrode CSE3 through the second contact hole CNT25. However, the disclosure is not limited thereto, and the light blocking layer BML may not be electrically connected to the third capacitor electrode CSE3.

The light blocking layer BML may be disposed to overlap at least the first semiconductor pattern ACT1 of the semiconductor layer 120, which will be described later, in the first transistor region TR1. The light blocking layer BML may be disposed to cover or overlap at least the channel region of the overlying first semiconductor pattern ACT1. However, the disclosure is not limited thereto, and the light blocking layer BML may be omitted, and may be disposed to overlap the semiconductor patterns ACT2 and ACT3 of the other transistors T2 and T3.

The first conductive layer 110 may include a material that blocks light. The first conductive layer 110 may include an opaque metal material that blocks the transmission of light. The first conductive layer 110 may include titanium (Ti) or copper (Cu). The first conductive layer 110 may be a single-layer film or a multi-layer film.

The buffer layer 161 may be disposed on the first conductive layer 110. The buffer layer 161 may be disposed to cover or overlap the entire surface of the substrate SUB on which the first conductive layer 110 may be disposed. The buffer layer 161 may serve to protect each of the transistors T1, T2, and T3 from moisture penetrating through the substrate SUB that may be vulnerable to moisture permeation. The buffer layer 161 may also perform a surface planarization function.

The buffer layer 161 may include first contact holes CNT12 and CNT16 penetrating the buffer layer 161 to expose parts of the first protrusion portion VDL_B and second protrusion portion VDL_C of the first voltage line VDL, and a second contact hole CNT27 penetrating the buffer layer 161 to expose a part of the protrusion portion VSL1_B of the second voltage line VSL. The upper surface of the first conductive layer 110 may electrically contact at least a part of the third conductive layer 140 through the first contact holes CNT12 and CNT16 included in the buffer layer 161, and may electrically contact at least a part of the fourth conductive layer 150 through the second contact hole CNT27.

The semiconductor layer 120 may be disposed on the buffer layer 161. The semiconductor layer 120 may include a first semiconductor pattern ACT1, a second semiconductor pattern ACT2, and a third semiconductor pattern ACT3. The first semiconductor pattern ACT1 may be active layer of the first transistor T1, the second semiconductor pattern ACT2 may be an active layer of the second transistor T2, and the third semiconductor pattern ACT3 may be an active layer of the third transistor T3.

The planar shape of each of the first semiconductor pattern ACT1, the second semiconductor pattern ACT2, and the third semiconductor pattern ACT3 may be a substantially rectangular shape having long sides in the first direction DR1 and short sides in the second direction DR2.

The first semiconductor pattern ACT1 may be disposed in the first transistor region TR1. One or an end region of the first semiconductor pattern ACT1 may overlap at least a part of the first transistor second electrode TE1 of the third conductive layer 140, which will be described later, in the third direction DR3. The other end or another end region of the first semiconductor pattern ACT1 may overlap at least a part of the first transistor first electrode TE2 of the fourth conductive layer 150 in the third direction DR3. The central portion of the first semiconductor pattern ACT1 disposed between both end regions of the first semiconductor pattern ACT1 may overlap the light blocking layer BML and at least a part of the first gate electrode GE1 of the second conductive layer 130, which will be described later, in the third direction DR3. Both end regions of the first semiconductor pattern ACT1 may be conducting regions (or doping regions) of the first transistor T1, and the central portion of the first semiconductor pattern ACT1 may be a channel region of the first transistor T1.

The second semiconductor pattern ACT2 may be disposed in the second transistor region TR2. One or an end region of the second semiconductor pattern ACT2 may overlap at least a part of the second transistor first electrode TE4 of the third conductive layer 140, which will be described later, in the third direction DR3. The other or another end region of the second semiconductor pattern ACT2 may overlap at least a part of the second transistor second electrode TE3 of the third conductive layer 140 in the third direction DR3. The central portion of the second semiconductor pattern ACT2 disposed between both end regions of the second semiconductor pattern ACT2 may overlap at least a part of the second gate electrode GE2 of the second conductive layer 130, which will be described later, in the third direction DR3. Both end regions of the second semiconductor pattern ACT2 may be conducting regions (or doping regions) of the second transistor T2, and the central portion of the second semiconductor pattern ACT2 may be a channel region of the second transistor T2.

The third semiconductor pattern ACT3 may be disposed in the third transistor region TR3. One or an end region of the third semiconductor pattern ACT3 may overlap at least a part of the third transistor first electrode TE5 of the fourth conductive layer 150, which will be described later, in the third direction DR3. The other or another end region of the third semiconductor pattern ACT3 may overlap at least a part of the third transistor second electrode TE6 of the fourth conductive layer 150 in the third direction DR3. The central portion of the third semiconductor pattern ACT3 disposed between both end regions of the third semiconductor pattern ACT3 may overlap at least a part of the third gate electrode GE3 of the second conductive layer 130, which will be described later, in the third direction DR3. Both end regions of the third semiconductor pattern ACT3 may be conducting regions (or doping regions) of the third transistor T3, and the central portion of the third semiconductor pattern ACT3 may be a channel region of the third transistor T3.

The semiconductor layer may include polycrystalline silicon, monocrystalline silicon, or an oxide semiconductor. Polycrystalline silicon may be formed by crystallizing amorphous silicon.

In an embodiment, the semiconductor layer 120 may include an oxide semiconductor. In a case that the semiconductor layer 120 may include an oxide semiconductor, each of the first to third semiconductor patterns ACT1, ACT2, and ACT3 may include a plurality of conducting regions and a channel region therebetween. The oxide semiconductor may be an oxide semiconductor containing indium (In). In an embodiment, the oxide semiconductor may be indium-tin oxide (ITO), indium-zinc oxide (IZO), indium-gallium oxide (IGO), indium-Indium-zinc-tin Oxide (IZTO), indium-gallium-zinc oxide (IGZO), indium-gallium-tin oxide (IGTO), or indium-gallium-zinc-tin oxide (IGZTO).

In an embodiment, the semiconductor layer 120 may include polycrystalline silicon. Polycrystalline silicon may be formed by crystallizing amorphous silicon, and in this case, the conducting regions of the first to third semiconductor patterns ACT1, ACT2, and ACT3 may be doping regions doped with impurities. However, the disclosure is not limited thereto.

The gate insulating layer 162 may be disposed on the semiconductor layer 120. The gate insulating layer 162 may be disposed on the semiconductor layer 120 and the buffer layer 161 exposed by the semiconductor layer 120. The gate insulating layer 162 may function as a gate insulating layer of the first to third transistors T1, T2, and T3.

The gate insulating layer 162 may include a plurality of contact holes CNT1 and CNT2 that penetrate the gate insulating layer 162 to expose a portion of the semiconductor layer 120. For example, the gate insulating layer 162 may include first contact hole CNT11 and second contact hole CNT21 exposing both end regions of the first semiconductor pattern ACT1, first contact holes CNT13 and CNT14 exposing both end regions of the second semiconductor pattern ACT2, and second contact holes CNT22 and CNT23 exposing both end regions of the third semiconductor pattern ACT3. The upper surface of the semiconductor layer 120 may electrically contact a part of the third conductive layer 140 and a part the fourth conductive layer 150, which will be described later, through the plurality of contact holes CNT1 and CNT2 included in the gate insulating layer 162.

The second conductive layer 130 may be disposed on the gate insulating layer 162. The second conductive layer 130 may include a scan line SCL, a sensing line SSL, first to third gate electrodes GE1, GE2, and GE3, and a first capacitor electrode CSE1. The second conductive layer 130 may further include a first voltage auxiliary line SVDL and a second voltage auxiliary line SVSL. Referring to FIGS. 3 and 7, the first voltage auxiliary line SVDL may correspond to a portion extending in the first direction DR1 of the first voltage line VDL shown in FIG. 3. The second voltage auxiliary line SVSL may correspond to a portion extending in the first direction DR1 of the second voltage line VSL shown in FIG. 3.

The second conductive layer 130 may be made of a low-resistance material. The second conductive layer 130 may include a material such as copper (Cu), titanium (Ti), molybdenum (Mo), aluminum (Al), or silver (Ag), but the material thereof is not limited thereto.

The scan line SCL may be disposed at the upper side of each of the sub-pixels SPX (SPX1, SPX2, and SPX3) in a plan view. The scan line SCL may extend in the first direction DR1. The scan line SCL may extend to another sub-pixel SPX neighboring in or adjacent to the first direction DR1.

The second gate electrode GE2 may be branched from the scan line SCL and may extend downward (or in a direction opposite to the second direction DR2). The second gate electrode GE2 may overlap the second transistor region TR2 in the third direction DR3. The second gate electrode GE2 may be a gate electrode of the second transistor T2. At least a part of the second gate electrode GE2 may be disposed to overlap the central portion of the second semiconductor pattern ACT2. The central portion of the second semiconductor pattern ACT2 overlapping the second gate electrode GE2 may be a channel region of the second transistor T2.

The sensing line SSL may be disposed under or below the scan line SCL to be spaced apart from the scan line SCL in a plan view. The sensing line SSL may be disposed at the lower side of each of the sub-pixels SPX1, SPX2, and SPX3 in a plan view. The sensing line SSL may extend in the first direction DR1. The sensing line SSL may extend in another sub-pixel SPX neighboring in or adjacent to the first direction DR1.

The third gate electrode GE3 may be branched from the sensing line SSL and may extend upward (or in the second direction DR2). The third gate electrode GE3 may overlap the third transistor region TR3 in the third direction DR3. The third gate electrode GE3 may be a gate electrode of the third transistor T3. At least a part of the third gate electrode GE3 may be disposed to overlap the central portion of the third semiconductor pattern ACT3. The central portion of the third semiconductor pattern ACT3 overlapping the third gate electrode GE3 may be a channel region of the third transistor T3.

The first capacitor electrode CSE1 may be generally disposed between the scan line SCL and the sensing line SSL at the right side of the sub-pixel SPX. For example, the first capacitor electrode CSE1 may be disposed to be spaced apart from the scan line SCL and the sensing line SSL at the lower side of the scan line SCL and the upper side of the sensing line SSL. In an embodiment, a part of the first capacitor electrode CSE1 may be disposed to overlap the second voltage line VSL in the third direction DR3. The first capacitor electrode CSE1 may have a shape that may protrude from the upper right side of a rectangle to the upper side thereof (or the second direction DR2) in a substantially planar rectangular shape, but the shape thereof is not limited thereto.

The first capacitor electrode CSE1 may be entirely disposed in the capacitor region CPR. The capacitor first electrode CSE1 may overlap the second capacitor electrode CSE2 of the second conductive layer 140 and the third capacitor electrode CSE3 of the fourth conductive layer 150, which will be described later, in the third direction DR3. The first capacitor electrode CSE1 may be electrically connected to the overlying third capacitor electrode CSE3 through the second contact hole CNT24.

The first gate electrode GE1 may be disposed to be spaced apart from the first capacitor electrode CSE1 downward (or in a direction opposite to the second direction DR2). The first gate electrode GE1 may overlap the first transistor region TR1 in the third direction DR3. At least part of the first gate electrode GE1 may be disposed to overlap the central portion of the first semiconductor pattern ACT1 in the first transistor region TR1. The first gate electrode GE1 may be a gate electrode of the first transistor T1. The central portion of the first semiconductor pattern ACT1 overlapping the first gate electrode GE1 may be a channel region of the first transistor T1.

The first gate electrode GE1 may be disposed to overlap a part of the light blocking layer BML of the first conductive layer 110 and the second capacitor electrode CSE2 of the third conductive layer 140, which will be described later, in the third direction DR3. The first gate electrode GE may be electrically connected to the capacitor second electrode CSE2, which will be described later, through the first contact hole CNT15.

Hereinafter, the first voltage auxiliary line SVDL and the second voltage auxiliary line SVSL will be described with reference to FIGS. 5 to 7.

The first voltage auxiliary line SVDL and the second voltage auxiliary line SVSL may be disposed under or below the sensing line SSL to be spaced apart from the sensing line SSL in a plan view. The first voltage auxiliary lines SVDL and the second voltage auxiliary lines SVSL may be alternately arranged or disposed in the plurality of pixels PX arranged or disposed in the second direction DR2. For example, the first voltage auxiliary lines SVDL may be arranged or disposed in the pixels PX arranged in odd rows, and may not be arranged or disposed in the pixels PX arranged in even rows. The second voltage auxiliary lines SVSL may be arranged or disposed in the pixels PX arranged or disposed in the even rows, and may not be arranged or disposed in the pixels PX arranged or disposed in the odd rows. However, the disclosure is not limited thereto, and the first voltage auxiliary lines SVDL may be arranged or disposed in the pixels PX arranged or disposed in even rows, and the second voltage auxiliary lines SVSL may be arranged or disposed in the pixels PX arranged or disposed in odd rows. However, the disclosure is not limited thereto, and both the first voltage auxiliary line SVDL and the second voltage auxiliary line SVSL may be disposed in one pixel PX.

The substantially planar shape and arrangement of the second voltage auxiliary line SVSL disposed in one pixel PX may be substantially similar to the substantially planar shape and arrangement of the first voltage auxiliary line SVDL. Hereinafter, the substantially planar shape of the first voltage auxiliary line SVDL disposed in one pixel PX (or one sub-pixel SPX) will be mainly described with reference to FIGS. 5 and 6, and a description of the planar shape of the second voltage auxiliary line SVSL may be omitted.

The first voltage auxiliary line SVDL may be disposed under or below the sensing line SSL to be spaced apart from the sensing line SSL in a plan view. The first voltage auxiliary line SVDL may extend in the first direction DR1. The first voltage auxiliary line SVDL may extend to another sub-pixel SPX neighboring in or adjacent to the first direction DR1.

The first voltage auxiliary line SVDL may include an extension portion and a contact portion protruding from the extension portion. The width of the contact portion of the first voltage auxiliary line SVDL in the second direction DR1 may be greater than the width of the extension portion of the first voltage auxiliary line SVDL in the second direction DR2. The first voltage auxiliary line SVDL may be generally formed as the extension portion, but may be formed as the contact portion in an area electrically connected to the third conductive layer 140 through the first contact hole CNT17 to be described later. The contact portion of the first voltage auxiliary line SVDL may be disposed to overlap the first conductive pattern DP1 of the third conductive layer 140 in the third direction DR3. The first voltage auxiliary line SVDL may be electrically connected to the first conductive pattern DP1 through the first contact hole CNT17.

Similarly, the second voltage auxiliary line SVSL may include an extension portion and a contact portion protruding from the extension portion. The second voltage auxiliary line SVSL may be formed as the extension portion, but may be formed as the contact portion in an area electrically connected to the fourth conductive layer 150 through the second contact hole CNT28 to be described later. The contact portion of the second voltage auxiliary line SVSL may be disposed to overlap the second conductive pattern DP2 of the fourth conductive layer 150 in the third direction DR3. The second voltage auxiliary line SVSL may be electrically connected to the second conductive pattern DP2 through the second contact hole CNT28.

The first interlayer insulating layer 163 may be disposed on the second conductive layer 130. The first interlayer insulating layer 163 may include a plurality of contact holes CNT1 and CNT2 passing through the first interlayer insulating layer 163.

The first interlayer insulating layer 163 may include an inorganic insulating material such as silicon oxide, silicon nitride, silicon oxynitride, hafnium oxide, aluminum oxide, titanium oxide, tantalum oxide, or zinc oxide, or may include an organic insulating material such as polyacrylate resin, epoxy resin, phenolic resin, polyamide resin, polyimides resin, unsaturated polyester resin, polyphenylene ether resin, polyphenylene sulfide resin, or benzocyclobutene (BCB). In an embodiment, the first interlayer insulating layer 163 may include SiON. The first interlayer insulating layer 163 may be a single-layer film or a multi-layer film formed of a stacked film of different materials.

The third conductive layer 140 may be disposed on the first interlayer insulating layer 163. The third conductive layer 140 may include an initialization voltage line VIL, a data line DTL, a second capacitor electrode CSE2, a first transistor second electrode TE1, a second transistor first electrode TE4, a second transistor second electrode TE3, and a first conductive pattern DP1.

The initialization voltage line VIL may be disposed in the first sub-pixel SPX1 of one pixel PX in a plan view. The initialization voltage line VIL may be disposed at the left side of the first sub-pixel SPX1 in a plan view. The initialization voltage line VIL may extend in the second direction DR2. The initialization voltage line VIL may extend to another sub-pixel SPX neighboring in or adjacent to the second direction DR2. A second contact hole CNT26 may be formed or disposed in an area where the initialization voltage line VIL intersects the initialization voltage auxiliary line SVIL of the fourth conductive layer 150, which will be described later, under or below the first sub-pixel SPX1. The initialization voltage line VIL and the initialization voltage auxiliary line SVIL may be electrically connected to each other through the second contact hole CNT26.

In the first sub-pixel SPX1, the data line DTL may be disposed on the right side of the initialization voltage line VIL to be spaced apart from the initialization voltage line VIL. The data line DTL may be disposed at the left side of each of the sub-pixels SPX SPX1, SPX2, and SPX3 in a plan view. The data line DTL may extend in the second direction DR2. The data line DTL may extend to another sub-pixel SPX neighboring in or adjacent to the second direction DR2.

The data line DTL may pass through the second transistor region TR2. A part of the data line DTL may protrude from an area overlapping the second transistor region TR2. The protrusion portion may be a second transistor second electrode TE3 of the second transistor T2. The data line DTL and the second transistor second electrode TE3 may be integrally formed.

The second transistor second electrode TE3 may overlap one or an end region of the second semiconductor pattern ACT2 in the third direction DR3. The second transistor second electrode TE3 may be electrically connected to the second semiconductor pattern ACT2 through the first contact hole CNT13 penetrating the gate insulating layer 162 and the first interlayer insulating layer 163 to expose one or an end region of the second semiconductor pattern ACT2.

The first transistor second electrode TE1 may be disposed in the first transistor region TR1.

In the first transistor region TR1, one or an end region of the first transistor second electrode TE1 may overlap the first protrusion portion VDL_B of the first voltage line VDL in the third direction DR3, and the other or another end region of the first transistor second electrode TE1 may overlap one or an end region of the first semiconductor pattern ACT1 in the third direction DR3. The first transistor second electrode TE1 may be electrically connected to the first voltage line VDL through the first contact hole CNT12 penetrating the buffer layer 161, the gate insulating layer 162, and the first interlayer insulating layer 163 to expose the first voltage line VDL (for example, the first protrusion portion VDL_B of the first voltage line VDL). Further, the first transistor second electrode TE1 may be electrically connected to the first semiconductor pattern ACT1 through the first contact hole CNT11 penetrating the gate insulating layer 162 and the first interlayer insulating layer 163 to expose one or an end region of the first semiconductor pattern ACT1.

The second capacitor electrode CSE2 may be disposed in the capacitor region CPR. The second capacitor electrode CSE2 may be entirely disposed in the capacitor region CPR, and may partially extend to be disposed to the outside of the capacitor region CPR.

The second capacitor electrode CSE2 disposed in an area extending to the outside of the capacitor region CPR may overlap the first gate electrode GE1 in the third direction DR3. The second capacitor electrode CSE2 may be electrically connected to the first gate electrode GE1 through the first contact hole CNT15 penetrating the first interlayer insulating layer 163 to expose the first gate electrode GE1.

In the capacitor region CPR, The second capacitor electrode CSE2 may be disposed between the first capacitor electrode CSE1 and the third capacitor electrode CSE3 so as to overlap the first capacitor electrode CSE1 and the third capacitor electrode CSE3 of the fourth conductive layer 150, which will be described later, in the third direction DR3. The second capacitor electrode CSE2 may be disposed to overlap the first capacitor electrode CSE1 with the first interlayer insulating layer 163 therebetween, and may be disposed to overlap the third capacitor electrode CSE3 with the passivation layer 164 therebetween, so as to form the capacitor CST. The first interlayer insulating layer 163 interposed between the second capacitor electrode CSE2 and the first capacitor electrode CSE1, and the passivation layer 164 interposed between the second capacitor electrode CSE2 and the third capacitor electrode CSE3 may be dielectrics of the capacitor CST.

In the capacitor region CPR, the second capacitor electrode CSE2 may be disposed so as not to overlap at least a part of the first capacitor electrode CSE1 and the light blocking layer BML, which may be disposed under or below the second capacitor electrode CSE2. For example, the second capacitor electrode CSE2 may be disposed to expose at least a part of the first capacitor electrode CSE1 and the light blocking layer BML, which may be disposed under or below the second capacitor electrode CSE2. In an area overlapping the second capacitor electrode CSE2, the third capacitor electrode CSE3, the first capacitor electrode CSE1, and the light blocking layer BML may be electrically connected to each other through the second contact holes CNT24 and CNT25.

The second transistor first electrode TE4 may be formed to protrude from the upper side of the second capacitor electrode CSE2. The second transistor first electrode TE4 may be disposed to be branched from an area disposed above the capacitor second electrode CSE2 in a direction opposite to the first direction DR1 to overlap the second transistor region TR2. The second transistor first electrode TE4 may overlap the other or another end region of the second semiconductor pattern ACT2 in the third direction DR3. The second transistor first electrode TE4 may be electrically connected to the second semiconductor pattern ACT2 through the first contact hole CNT14 penetrating the gate insulating layer 162 and the first interlayer insulating layer 163 to expose the other or another end region of the second semiconductor pattern ACT2.

The first conductive pattern DP1 may be disposed under or below each of the sub-pixels SPX (SPX1, SPX2, and SPX3) in a plan view. The first conductive pattern DP1 may be disposed adjacent to an area where the first voltage line VDL extending in the second direction DR2 intersects the first voltage auxiliary line SVDL extending in the first direction DR1. The first conductive pattern DP1 may be disposed to overlap the first voltage line VDL and the first voltage auxiliary line SVDL in the third direction DR3. For example, one or an end region of the first conductive pattern DP1 may overlap the second protrusion portion VDL_C of the first voltage line VDL, and the other or another end region of the first conductive pattern DP1 may overlap the first voltage auxiliary line SVDL. The first conductive pattern DP1 may be electrically connected to the first voltage line VDL through the first contact hole CNT16 penetrating the buffer layer 161, the gate insulating layer 162, and the first interlayer insulating layer 163, and may be electrically connected to the first voltage auxiliary line SVDL through the first contact hole CNT17 penetrating the first interlayer insulating layer 163, so as to serve to electrically connect the first voltage line VDL and the first voltage auxiliary line SVDL. The first voltage auxiliary line SVDL may be electrically connected to the first voltage line VDL through the first conductive pattern DP1, thereby serving to equally transmit a first power supply voltage to the plurality of pixels PX such that the first power supply voltage transmitted to each pixel PX may not differ due to a voltage drop.

The passivation layer 164 may be disposed on the third conductive layer 140. The passivation layer 164 may serve to cover or overlap and protect the third conductive layer 140. The passivation layer 164 may include a plurality of second contact holes CNT2 penetrating the passivation layer 164. The passivation layer 164 may include an inorganic insulating material such as silicon oxide (SiOx), silicon nitride (SiNx), or silicon oxynitride (SiOxNy).

The fourth conductive layer 150 may be disposed on the passivation layer 164. The fourth conductive layer 150 may include a first transistor first electrode TE2, a third transistor first electrode TE5, a third transistor second electrode TE6, a third capacitor electrode CSE3, and an initialization voltage auxiliary line. SVIL, and a second conductive pattern DP2.

The third capacitor electrode CSE3 may be disposed in the capacitor region CPR. The third capacitor electrode CSE3 may be entirely disposed in the capacitor region CPR. The third capacitor electrode CSE3 may overlap parts of the first capacitor electrode CSE1, the second capacitor electrode CSE2, and the light blocking layer BML in the third direction DR3. As described above, the second capacitor electrode CSE2 does not overlap parts of the first capacitor electrode CSE1 and the light blocking layer BML, which may be disposed under or below the second capacitor electrode CSE2, to expose the first capacitor electrode CSE1 and the light blocking layer BML, which may be disposed under or below the second capacitor electrode CSE2, in the third direction DR3. The first capacitor electrode CSE1 and the light blocking layer BML exposed by the second capacitor electrode CSE2 may be electrically connected to the third capacitor electrode CSE3 through the second contact holes CNT24 and CNT25, respectively.

For example, the third capacitor electrode CSE3 may be electrically connected to the light blocking layer BML through the second contact hole CNT25 penetrating the buffer layer 161, the gate insulating layer 162, the first interlayer insulating layer 163, and the passivation layer 164 to expose a part of the light blocking layer BML. Further, the third capacitor electrode CSE3 may be electrically connected to the first capacitor electrode CSE1 through the second contact hole CNT24 penetrating the first interlayer insulating layer 163 and the passivation layer 164 to expose the first capacitor electrode CSE1. The third capacitor electrode CSE3 may be electrically connected to the first capacitor electrode CSE1 through the second contact hole CNT24.

The first interlayer insulating layer 163 interposed between the second capacitor electrode CSE2 and the first capacitor electrode CSE1, and the passivation layer 164 interposed between the third capacitor electrode CSE3 and the second capacitor electrode CSE2 electrically connected to the first capacitor electrode CSE1 may form capacitors CST, respectively, for example, may form capacitors CST electrically connected in parallel to each other. For example, the first capacitor electrode CSE1 and the third capacitor electrode CSE3 may be electrically connected to each other, so that the area of the capacitor may be increased in proportion to capacitance, thereby preventing the reduction of capacitance.

The first transistor first electrode TE2 may be formed to protrude from the lower side of the third capacitor electrode CSE3. The first transistor first electrode TE2 may be disposed to be branched from the lower side of the third capacitor electrode CSE3 in a direction opposite to the first direction DR1 to overlap the first transistor region TR1. The first transistor first electrode TE2 may overlap the other or another end region of the first semiconductor pattern ACT1 in the third direction DR3. The first transistor first electrode TE2 may be electrically connected to the first semiconductor pattern ACT1 through the second contact hole CNT21 penetrating the gate insulating layer 162, the first interlayer insulating layer 163, and the passivation layer 164 to expose the other or another end region of the first semiconductor pattern ACT1.

The third transistor second electrode TE6 may be formed to protrude from the lower side of the third capacitor electrode CSE3. The third transistor second electrode TE6 may be formed to extend downward from the first transistor first electrode TE2. The third transistor second electrode TE6 may be disposed to be branched from the lower side of the third capacitor electrode CSE3 in a direction opposite to the second direction DR2 to overlap the third transistor region TR3. The third transistor second electrode TE6 may overlap the other or another end region of the third semiconductor pattern ACT3 in the third direction DR3. The third transistor second electrode TE6 may be electrically connected to the third semiconductor pattern ACT3 through the second contact hole CNT23 penetrating the gate insulating layer 162, the first interlayer insulating layer 163, and the passivation layer 164 to expose the other or another end region of the third semiconductor pattern ACT3.

The initialization voltage auxiliary line SVIL may be disposed under or below each of the sub-pixels SPX (SPX1, SPX2, and SPX3) in a plan view. The initialization voltage auxiliary line SVIL may be disposed between the sensing line SSL and the first voltage auxiliary line SVDL in a plan view. However, the disclosure is not limited thereto, and the initialization voltage auxiliary line SVIL may be disposed to overlap at least a part of the sensing line SSL and the first voltage auxiliary line SVDL in the third direction DR3. The initialization voltage auxiliary line SVIL may extend in the first direction DR1. The initialization voltage auxiliary line SVIL may be disposed for each pixel PX, and may be disposed to extend to another sub-pixel SPX neighboring in or adjacent to the first direction DR1. The initialization voltage auxiliary line SVIL extends in the first direction DR1 and may extend to another sub-pixel SPX included in one pixel PX and neighboring in or adjacent to the first direction DR1, but may not extend to the pixel PX neighboring in or adjacent to the first direction DR2.

As described above, the second contact hole CNT26 may be formed or disposed in an area where the initialization voltage line VIL intersects the initialization voltage auxiliary line SVIL under or below the first sub-pixel SPX1. The initialization voltage auxiliary line SVIL may be electrically connected to the initialization voltage line VIL through the second contact hole CNT26 penetrating the passivation layer 164 to expose the initialization voltage line VIL. The initialization voltage auxiliary line SVIL may be electrically connected to the initialization voltage line VIL to transfer an initialization voltage applied for each pixel PX to each sub-pixel SPX.

The third transistor first electrode TE5 may be branched from the initialization voltage auxiliary line SVIL in the second direction DR2. The third transistor first electrode TE5 may be disposed to be branched from the initialization voltage auxiliary line SVIL in the second direction DR2 to overlap the third transistor region TR3. The third transistor first electrode TE5 may overlap the other or another end region of the third semiconductor pattern ACT3 in the third direction DR3. The third transistor first electrode TE5 may be electrically connected to the third semiconductor pattern ACT3 through the second contact hole CNT22 penetrating the gate insulating layer 162, the first interlayer insulating layer 163, and the passivation layer 164 to expose the other or another end region of the third semiconductor pattern ACT3.

The second conductive pattern DP2 may be disposed under or below each of the sub-pixels SPX (SPX1, SPX2, and SPX3) in a plan view. In the second conductive pattern DP2, one or an end region of the second conductive pattern DP2 may overlap the protrusion portion VSL_B of the second voltage line VSL in one sub-pixel SPX, and the other or another end region of the second conductive pattern DP2 may be disposed to extend the sub-pixel SPX neighboring in or adjacent to the first direction DR1. For example, the second conductive pattern DP2 may be disposed in the boundary area of the plurality of sub-pixels SPX included in one pixel PX. The second conductive pattern DP2 may be disposed between the first conductive patterns DP1 of the adjacent sub-pixel SPX in a plan view, but the disclosure is not limited thereto. One or an end of the second conductive pattern DP2 may be disposed to overlap the protrusion VSL_B of the second voltage line VSL, and the other or another end thereof may be disposed to overlap a protrusion portion REM2_P (refer to FIG. 13) of the second electrode RME2, which will be described later, in the sub-pixel SPX adjacent in the first direction DR1.

The second conductive pattern DP2 may be electrically connected to the second voltage line VSL through the second contact hole CNT27 penetrating the buffer layer 161, the gate insulating layer 162, the first interlayer insulating layer 163, and the passivation layer 164. The second conductive pattern DP2 may be disposed between the second voltage line VSL and the second electrode RME2 of the light emitting element layer EML to electrically connect them to each other. For example, the second conductive pattern DP2 may serve to transmit a signal applied through the second voltage line VSL to the light emitting element ED through the second electrode RME2.

Referring to FIGS. 5 to 7, the second conductive pattern DP2 may be disposed adjacent to an area where the second voltage line VSL extending in the second direction DR2 intersects the second voltage auxiliary line SVSL extending in the first direction DR1.

In the pixel PX where the second voltage auxiliary line SVSL may be disposed, the second conductive pattern DP2 may be disposed to overlap the second voltage line VSL and the second voltage auxiliary line SVSL in the third direction DR3. For example, in the pixel PX where the second voltage auxiliary line SVSL may be disposed, one or an end region of the second conductive pattern DP2 may overlap the protrusion portion VSL_B of the second voltage line VSL, and the other or another end region of the second conductive pattern DP2 may overlap the second voltage auxiliary line SVSL. The second conductive pattern DP2 may be electrically connected to the second voltage line VSL through the second contact hole CNT27 penetrating the buffer layer 161, the gate insulating layer 162, the first interlayer insulating layer 163, and the passivation layer 164, and may be electrically connected to the second voltage line VSL through the second contact hole CNT28 penetrating the first interlayer insulating layer 163 and the passivation layer 164, so as to serve to electrically connect the second voltage line VSL and the second voltage auxiliary line SVSL. The second voltage auxiliary line SVDL may be electrically connected to the second voltage line VSL through the second conductive pattern DP2, thereby serving to equally transmit a second power supply voltage to the plurality of pixels PX such that the second power supply voltage transmitted to each pixel PX does not differ due to a voltage drop.

The fourth conductive layer 150 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The second interlayer insulating layer 165 may be disposed on the fourth conductive layer 150. The second interlayer insulating layer 165 may perform an insulating function between the fourth conductive layer 150 and other layers disposed thereon. For example, the second interlayer insulating layer 165 may perform a function of covering or overlapping the fourth conductive layer 150 and protecting the fourth conductive layer 150. For example, the second interlayer insulating layer 165 may perform a surface planarization function. In an embodiment, the second interlayer insulating layer 165 may include silicon nitride (SiNx) and protect the fourth conductive layer 150 in the process of forming members disposed thereon, or may include an organic insulating material such as polyimide (PI). However, the second interlayer insulating layer 165 may be omitted, or may be integral with the second bank IBK to be described later.

Figure 11:
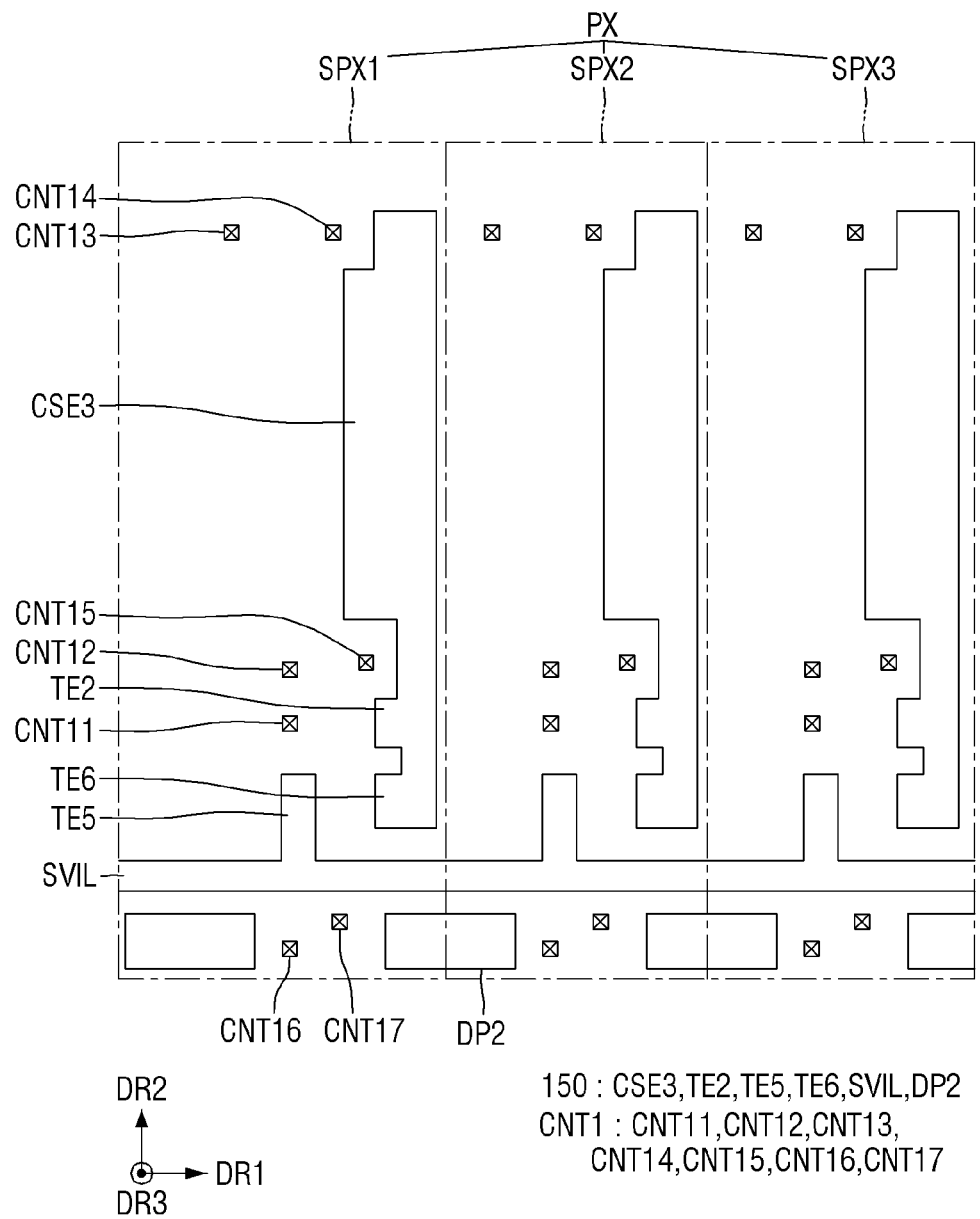
FIG. 11 is a plan view illustrating a relative arrangement of a fourth conductive layer and a first contact hole in a circuit element layer according to an embodiment.

FIG. 11 is a plan view illustrating the relative arrangement of a fourth conductive layer and a first contact hole in a circuit element layer according to an embodiment.

FIG. 11 illustrates only the fourth conductive layer 150 and the plurality of first contact holes CNT1 arranged or disposed in one pixel PX.

Referring to FIG. 11, the fourth conductive layer 150, which may be the uppermost conductive layer of the circuit element layer CCL, may form island-shaped or isolated shaped patterns that may be spaced apart from each other for each pixel PX. For example, the fourth conductive layer 150 may not extend to the pixels PX disposed adjacent to each other in the first direction DR1 and/or the second direction DR2.

The display device 10 may include a plurality of first contact holes (CNT1: CNT11, CNT12, CNT13, CNT14, CNT15, CNT16, and CNT17) formed in order for the third conductive layer 140 to be electrically connected to a plurality of members, for example, the first conductive layer 110, the semiconductor layer 120, and the second conductive layer 130, which may be arranged or disposed under or below the third conductive layer 140. In an embodiment, the fourth conductive layer 150 may not overlap the plurality of first contact holes CNT1 in the third direction DR3.

For example, the fourth conductive layer may be formed in order of processes of patterning and forming the third conductive layer 140 on the first interlayer insulating layer, forming the passivation layer 164 on the third conductive layer 140, and patterning the fourth conductive layer 150 on the passivation layer 164 after the process of forming the first contact hole CNT1 penetrating the buffer layer 161, the gate insulating layer, or the first interlayer insulating layer. In this case, there may occur an insulating layer failure that the thickness of the passivation layer 164 cannot be evenly formed due to a step caused by the first contact hole CNT1 formed to electrically connect the third conductive layer 140 to the underlying members in an area around the first contact hole CNT1. An electrical short may occur between the third conductive layer 140 and the fourth conductive layer 150 due to the failure of the insulating layer (for example, the passivation layer 164) disposed between the third conductive layer 140 and the fourth conductive layer 150.

Accordingly, as in the disclosure, the fourth conductive layer 150 and the plurality of first contact holes CNT1 included in the display device 10 may be designed not to overlap each other in the third direction DR3, so that a part of the insulating layer (for example, the passivation layer 164) interposed between the third conductive layer 140 and the fourth conductive layer 150, in which a step may occur due to the first contact hole CNT1, and the fourth conductive layer 150 may be arranged or disposed not to overlap each other in the third direction DR3, thereby preventing the occurrence of short between the third conducive layer 140 and the fourth conductive layer 150. A part of the insulating layer interposed between the third conductive layer 140, in which a step may occur due to the first contact hole CNT1, and the fourth conductive layer 150 may include an area overlapping the first contact hole CNT1 in the third direction DR3 and a peripheral area thereof. Accordingly, the failure of the insulating layer, occurring due to the first contact hole CNT1, may be minimized to improve the reliability of the display device 10.

Figure 12:
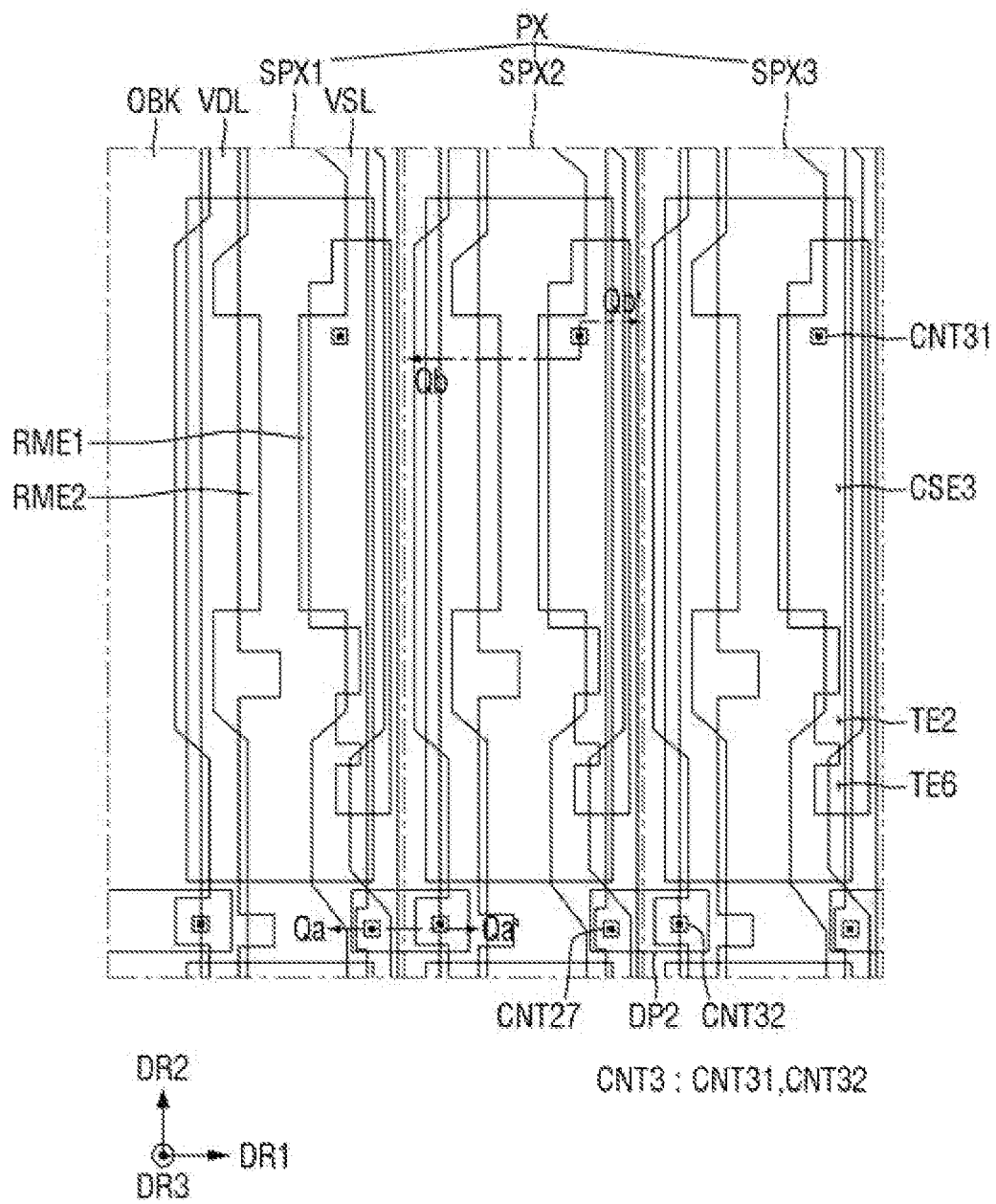
FIG. 12 is a schematic layout view illustrating a conductive layer of a circuit element layer, a plurality of electrodes of a light emitting element layer, and a second bank, which are included in one pixel of a display device according to an embodiment.
Figure 13:
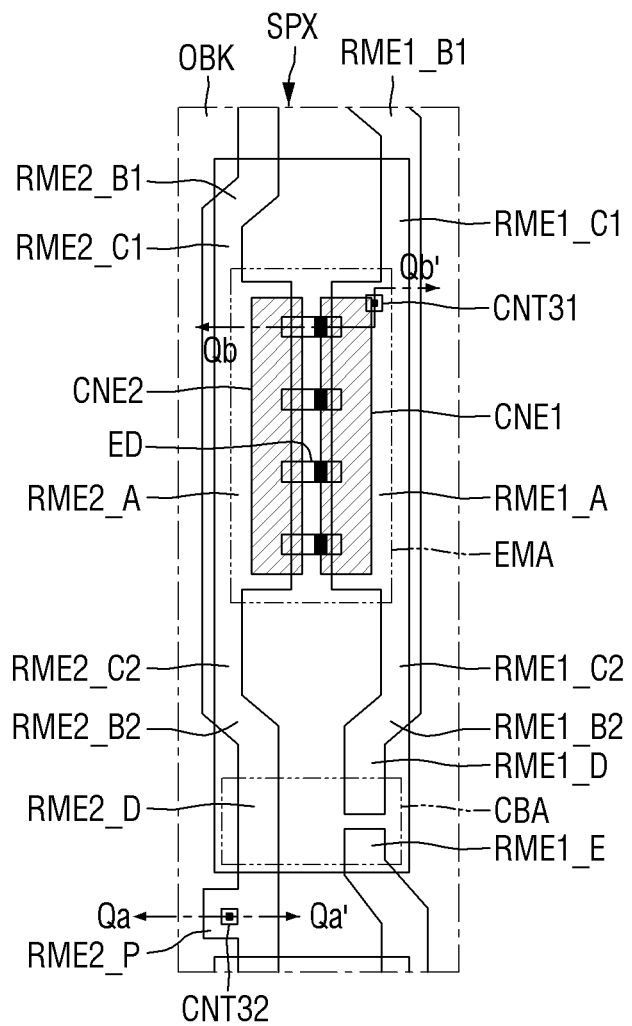
FIG. 13 is a schematic layout view illustrating a plurality of electrodes, a contact electrode, a light emitting element, and a first bank of a light emitting element layer, which are included in one sub-pixel of FIG. 12.
Figure 13:
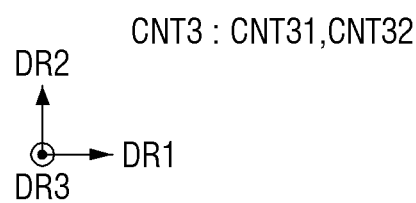

FIG. 12 is a schematic layout view illustrating a conductive layer of a circuit element layer, a plurality of electrodes of a light emitting element layer, and a second bank, which may be included in one pixel of a display device according to an embodiment. FIG. 13 is a schematic layout view illustrating a plurality of electrodes, a contact electrode, a light emitting element, and a first bank of a light emitting element layer, which may be included in one sub-pixel of FIG. 12.

FIGS. 12 and 13 show the first and second voltage lines VDL and VSL, the third capacitor electrode CSE3 of the fourth conductive layer 150, and the second conductive pattern DP2, which may be included in the circuit element layer CCL of the display device 10, are shown, and show only the first bank OBK, the first and second electrodes RME1 and RME2, the plurality of light emitting elements ED, and the first and second contact electrodes CNE1 and CNE2, which may be included in the light emitting element layer EML FIGS. 12 and 13 omit some or a predetermined number of members of the light emitting element layer EML and some or a predetermined number of conductive layers of the circuit element layer CCL disposed under or below the light emitting element layer EML.

Referring to FIGS. 12 and 13, each of the sub-pixels SPX of the display device 10 may include a light emission area EMA and a non-light emission area (not shown). The light emission area EMA may be an area through which light emitted from the light emitting element ED may be output, and the non-light emission area may be an area in which light emitted from the light emitting element ED may not reach and thus light may not be output.

The light emission area EMA may include an area in which the light emitting element ED may be disposed and an area adjacent thereto. The light emission area EMA may further include an area in which light emitted from the light emitting element ED may be reflected or refracted by another member and may be output.

Each sub-pixel SPX may further include a cut-out area CBA disposed in the non-emission area. The cut-out area CBA may be disposed at the other side of the light emission area EMA opposite to one or a side thereof in the second direction DR2. The cut-out area CBA may be disposed between the light emission areas EMA of the sub-pixel SPX neighboring in or adjacent to the second direction DR2. For example, the cut-out area CBA included in the sub-pixel SPX may be disposed under or below the light emission area EMA.

The cut-out area CBA may be an area in which the first electrodes RME1 included in each of the sub-pixels SPX adjacent to each other along the second direction DR2 may be separated from each other. The light emitting element ED may not be disposed in the cut-out area CBA. For example, some or a predetermined number of the first and second electrodes RME1 and RME2 disposed for each sub-pixel SPX may be disposed in the cut-out area CBA. The first electrodes RME1 disposed for each sub-pixel SPX may be separated from each other in the cut-out area CBA. Although it is shown in the drawings that in the cut-out area CBA, the first electrode RME1 may be separated, and the second electrode REM2 may extend to the adjacent sub-pixel SPX in the second direction DR2 to be integral with the sub-pixel SPX, the disclosure is not limited thereto. For example, all of the first and second electrodes RM2 and RME2 may extend to the adjacent sub-pixel SPX in the second direction DR2 to be integral with the sub-pixel SPX, or may be separated from the cut-out area CBA.

The first bank OBK may include portions extending in the first direction DR1 and the second direction DR2 in a plan view, and may be disposed in a grid pattern over the entire surface of the display area DPA. The first bank OBK may be disposed over the boundary of each of the sub-pixels SPX to distinguish neighboring sub-pixels SPX. For example, the first bank OBK may be disposed so as to surround the light emission area EMA and the cut-out area CBA disposed for each sub-pixel SPX to distinguish them. Details of the first bank OBK will be described later.

The first voltage line VDL may extend in the second direction DR2 so as to overlap a part of the first bank OBK extending in the first direction DR1. The first voltage line VDL may extend in the second direction DR2, but may be disposed in an area partitioned by the first bank OBK in a plan view. The first voltage line VDL may be disposed to overlap the second electrode RME2 in the third direction DR3.

The second voltage line VSL may extend in the second direction DR2 so as to overlap a part of the first bank OBK extending in the second direction DR2. The second voltage line VSL may be disposed adjacent to the boundary of the sub-pixel SPX. The second voltage line VSL may be disposed to be adjacent to the second electrode RME2 disposed in the sub-pixel SPX disposed adjacent in the first direction DR1 in a plan view. The protrusion portion VSL_B of the second voltage line VSL electrically connected to the second conductive pattern DP2 of the fourth conductive layer 150 may be disposed to overlap the first bank OBK.

The first electrode RME1 may be disposed at the right side of each of the sub-pixels SPX (SPX1, SPX2, and SPX3) in a plan view. The first electrode RME1 may have a shape extending in the second direction DR2. The first electrode RME1 may generally be disposed in an area partitioned by the first bank OBK, but may extend in the second direction DR2 so as to overlap a part of the first bank OBK extending in the first direction DR1 in a plan view. The first electrode RME1 may extend from one sub-pixel SPX, but may be terminated in the cut-out area CBA so as to be spaced apart from the first electrodes RME1 of the sub-pixel SPX neighboring in or adjacent to the second direction DR2 in the second direction DR2.

The first electrode RME1 may be disposed to partially overlap the third capacitor electrode CSE3 of the fourth conductive layer 150 and one or an end region of the second conductive pattern DP2 of the fourth conductive layer 150 in the third direction DR3. The first electrode RME1 may be electrically connected to the third capacitor electrode CSE3 through a third contact hole CNT31 in an area overlapping the third capacitor electrode CSE3 of the fourth conductive layer 150. As described above, as the third capacitor electrode CSE3 may be formed to be integral with the first transistor first electrode TE2 and the third transistor second electrode TE6, the first electrode RME1 may be electrically connected to the first transistor T1 through the third capacitor electrode CSE3 (or the first transistor first electrode TE2 or the third transistor second electrode TE6). The third capacitor electrode CSE3 may transmit a first power supply voltage applied from the first voltage line VDL to the first electrode RME1. Details thereof will be described later.

The second electrode RME2 may be disposed to be spaced apart from the first electrode RME1 at the left side of the first electrode RME1 in a plan view. The second electrode RME2 may have a shape extending in the second direction DR2. The second electrode RME2 may generally be disposed in an area partitioned by the first bank OBK, but may extend in the second direction DR2 so as to overlap a part of the first bank OBK extending in the first direction DR1 in a plan view. The second electrode RME2 may be disposed to extend from one sub-pixel SPX.

The second electrode RME2 may be disposed to partially overlap one or an end region of the second conductive pattern DP2 of the fourth conductive layer 150 in the third direction DR3. The second electrode RME2 may be electrically connected to the second conductive pattern DP2 through the third contact hole CNT32 in an area overlapping the second conductive pattern DP2 of the fourth conductive layer 150. As described above, the second conductive pattern DP2 may be electrically connected to the second power supply line VSL through the second contact hole CNT27. Accordingly, the second electrode RME2 may be electrically connected to the second voltage line VSL through the second conductive pattern DP2. Details thereof will be described later.

Meanwhile, the first electrode RME1 may be separated from another electrode RME1 included in the sub-pixel SPX neighboring in or adjacent to the second direction DR2 in the cut-out area CBA. This shape of the first electrode RME1 may be formed through a process of disconnecting the first electrode RME1 in the cut-out area CBA after the process of placing the light emitting element ED during the manufacturing process of the display device 10. However, the disclosure is not limited thereto, and some or a predetermined number of the electrodes RME1 and RME2 may extend to the sub-pixel SPX neighboring in or adjacent to the second direction DR2 to be integral with the sub-pixel SPX, or may be respectively separated from the cut-out area CBA.

Hereinafter, the substantially planar shapes of the first and second electrodes RME1 and RME2 will be described with reference to FIG. 13.

Referring to FIG. 13, the first electrode RME1 may include an expansion portion RME1_A, first and second bending portions RME1_B1 and RME1_B2 spaced apart from the expansion portion RME1_A and extending in an inclined direction, and first and second connection portions RME1_C1 and RME1_C2 disposed between the expansion portion RME1_A and the first and second bending portions RME1_B1 and RME1_B2 to electrically connect the expansion portion RME1_A and the first and second bending portions RME1_B1 and RME1_B2. The first electrode RME1 may further include a first end portion RME1_D and a second end portion RME1_E.

The expansion portion RME1_A of the first electrode RME1 may have a larger width than other portions. The expansion portion RME1_A of the first electrode RME1 may be disposed in the light emission area EMA and extend in the second direction DR2. The expansion portion RME1_A of the first electrode RME1 may be disposed closer to the second electrode RME2 than other portions, and the light emitting element ED may be disposed on the expansion portion RME2_A of the second electrode RME2, which will be described later, and the expansion portion RME1_A of the first electrode RME1. The expansion portion RME1_A of the first electrode RME1 may overlap the third contact hole CNT31 in the third direction DR3, and may be electrically connected to the third capacitor electrode CSE3 of the fourth conductive layer 150 through a third contact hole CNT3.

The first and second bending portions RME1_B1 and RME1_B2 may be disposed at both sides of the expansion portion RME1_A of the first electrode RME1 in the second direction DR2, respectively. For example, the first bending portion RME1_B1 may be disposed at the upper side of the expansion portion RME1_A to be spaced apart from the expansion portion RME1_A, and the second bending portion RME1_B2 may be disposed at the lower side of the expansion portion RME1_A to be spaced apart from the expansion portion RME1_A. The first and second bending portions RME1_B1 and RME1_B2 may be bent in a direction inclined from the second direction DR2, for example, toward the center of the sub-pixel SPX.

The first and second connection portions RME1_C1 and RME1_C2 may be disposed between the expansion portion RME1_A of the first electrode RME1 and the first and second bending portions RME1_B1 and RME1_B2 of the first electrode RME1. For example, the first connection portion RME1_C1 may be disposed between the first bending portion RME1_B1 and the expansion portion RME1_A to electrically connect the first bending portion RME1_B1 and the expansion portion RME1_A, and the second connection portion RME1_C2 may be disposed between the second bending portion RME1_B2 and the expansion portion RME1_A to electrically connect the second bending portion RME1_B2 and the expansion portion RME1_A.

The first end portion RME1_D and second end portion RME1_E of the first electrode RME1 may be disposed in the cut-out area CBA. The first end RME1_D and the second end RME1_E may be formed through a process of disconnecting the first electrode RME1 in the cutout area CBA after the process of placing the light emitting element ED during the manufacturing process of the display device 10.

The second electrode RME2 may include an expansion portion RME2_A, first and second bending portions RME2_B1 and RME2_B2 spaced apart from the expansion portion RME2_A and extending in an inclined direction, and first and second connection portions RME2_C1 and RME2_C2 disposed between the expansion portion RME2_A and the first and second bending portions RME2_B1 and RME2_B2 to electrically connect the expansion portion RME2_A and the first and second bending portions RME2_B1 and RME2_B2. The second electrode RME2 may further include an extension portion RME2_D and a contact portion RME2_P.

The expansion portion RME2_A of the second electrode RME2 may have a larger width than other portions. The expansion portion RME2_A of the second electrode RME2 may be disposed in the light emission area EMA and extend in the second direction DR2. The expansion portion RME2_A of the second electrode RME2 may be disposed closer to the first electrode RME1 than other portions, and the light emitting element ED may be disposed on the expansion portion RME2_A of the second electrode RME2 and the expansion portion RME1_A of the first electrode RME1.

The first and second bending portions RME2_B1 and RME2_B2 may be disposed at both sides of the expansion portion RME2_A of the second electrode RME2 in the second direction DR2, respectively. For example, the first bending portion RME2_B1 may be disposed at the upper side of the expansion portion RME2_A to be spaced apart from the expansion portion RME2_A, and the second bending portion RME2_B2 may be disposed at the lower side of the expansion portion RME2_A to be spaced apart from the expansion portion RME2_A. The first and second bending portions RME2_B1 and RME2_B2 may be bent in a direction inclined from the second direction DR2, for example, toward the center of the sub-pixel SPX.

The first and second connection portions RME2_C1 and RME2_C2 may be disposed between the expansion portion RME2_A of the second electrode RME2 and the first and second bending portions RME2_B1 and RME2_B2 of the second electrode RME2. For example, the first connection portion RME2_C1 may be disposed between the first bending portion RME2_B1 and the expansion portion RME2_A to electrically connect the first bending portion RME2_B1 and the expansion portion RME2_A, and the second connection portion RME2_C2 may be disposed between the second bending portion RME2_B2 and the expansion portion RME2_A to electrically connect the second bending portion RME2_B2 and the expansion portion RME2_A.

The extension portion RME2_D of the second electrode RME2 may be formed to extend downward from the second bent portion RME2_B2. The extension portion RME2_D of the second electrode RME2 may include a contact portion REM2_P having a relatively large width. The contact portion RME2_P may be disposed to overlap the first bank OBK. The contact portion RME2_P of the second electrode RME2 may be disposed to overlap the above-described second conductive pattern DP2 of the fourth conductive layer 150. The contact portion RME2_P of the second electrode RME2 may be electrically connected to the second conductive pattern DP2 electrically connected to the second voltage line VSL through the third contact hole CNT32.

The distance between the first electrode RME1 and second electrode RME2 may be different for each area. In the distance between the first electrode RME1 and the second electrode RME2, the distance between the expansion portions RME1_A and RME2_A of each of the electrodes RME1 and RME2 may be smaller than the distance between other portions.

The shape and arrangement of the first electrode RME1 and second electrode RME2 disposed for each sub-pixel SPX are not particularly limited as long as at least some or a predetermined number of regions of the first electrode RME1 and the second electrode RME2 may be disposed to be spaced from each other and face each other, thereby forming a space in which the light emitting element ED may be disposed. Although it is shown in the drawing that one first electrode RME1 and one second electrode RME2 may be disposed for each sub-pixel SPX, the disclosure is not limited thereto, and the number of the first electrode RME1 and the second electrode RME2 disposed for each sub-pixel SPX may be larger.

Both ends of each of the light emitting elements ED may be disposed on the expansion portion RME1_A of the first electrode RME1 and the expansion portion RME2_A of the second electrode RME2. Among both ends of the light emitting element ED, one or an end on which the first semiconductor layer 31 may be disposed may be disposed on the second electrode RME2.

The first and second electrodes RME1 and RME2 may be electrically connected to the light emitting elements ED, respectively, and a predetermined voltage may be applied to the first and second electrodes RME1 and RME2 in order of the light emitting element ED to emit light. For example, the plurality of electrodes RME1 and RME2 may be electrically connected to the light emitting element ED disposed between the first electrode RME1 and the second electrode RME2 through contact electrodes CNE1 and CNE2 to be described later, and may transmit electrical signals applied to the electrodes RME1 and RME2 to the light emitting element ED through the contact electrodes CNE1 and CNE2.

Each of the electrodes RME1 and RME2 may be utilized to form an electric field in the sub-pixel SPX in order to align the light emitting elements ED. The light emitting elements ED may be disposed between the first electrode RME1 and the second electrode RME2 by an electric field formed on the first electrode RME1 and the second electrode RME2. In an embodiment, the light emitting elements ED of the display device 10 may be sprayed onto the electrodes RME1 and RME2 through an inkjet printing process. In a case that an ink including the light emitting elements ED may be sprayed onto the electrodes RME1 and RME2, alignment signals may be applied to the electrodes RME1 and RME2 to form an electric field. The light emitting elements ED dispersed in the ink may receive a dielectrophoresis force by an electric field formed on the electrodes RME1 and RME2 to be aligned on the electrodes RME1 and RME2.

The display device 10 may include a plurality of contact electrodes CNE1 and CNE2. The plurality of contact electrodes CNE1 and CNE2 may include a first contact electrode CNE1 and a second contact electrode CNE2. The first contact electrode CNE1 may be disposed on the first electrode RME1. For example, the first contact electrode CNE1 may be disposed on the expansion portion RME1_A of the first electrode RME1. Similarly, the second contact electrode CNE2 may be disposed on the second electrode RME2. For example, the second contact electrode CNE2 may be disposed on the expansion portion RME2_A of the second electrode RME2.

Each of the first and second contact electrodes CNE1 and CNE2 may have a shape extending in one direction in a plan view. Each of the first contact electrode CNE1 and the second contact electrode CNE2 may have a shape extending in the second direction DR2. The first contact electrode CNE1 and the second contact electrode CNE2 may be disposed to be spaced from each other and face each other in the first direction DR1. The first contact electrode CNE1 and the second contact electrode CNE2 may form a stripe-type pattern in the light emission area EMA of each sub-pixel SPX.

The first and second contact electrodes CNE1 and CNE2 may be in electrically contact with the light emitting element ED and the plurality of electrodes RME1 and RME2, respectively. The first contact electrode CNE1 and the second contact electrode CNE2 may be in electrically contact with one or an end and the other or another end of the light emitting element ED, respectively, and may be disposed to partially cover or overlap the upper surfaces of the first electrode RME1 and the second electrode RME2, respectively.

Figure 14:
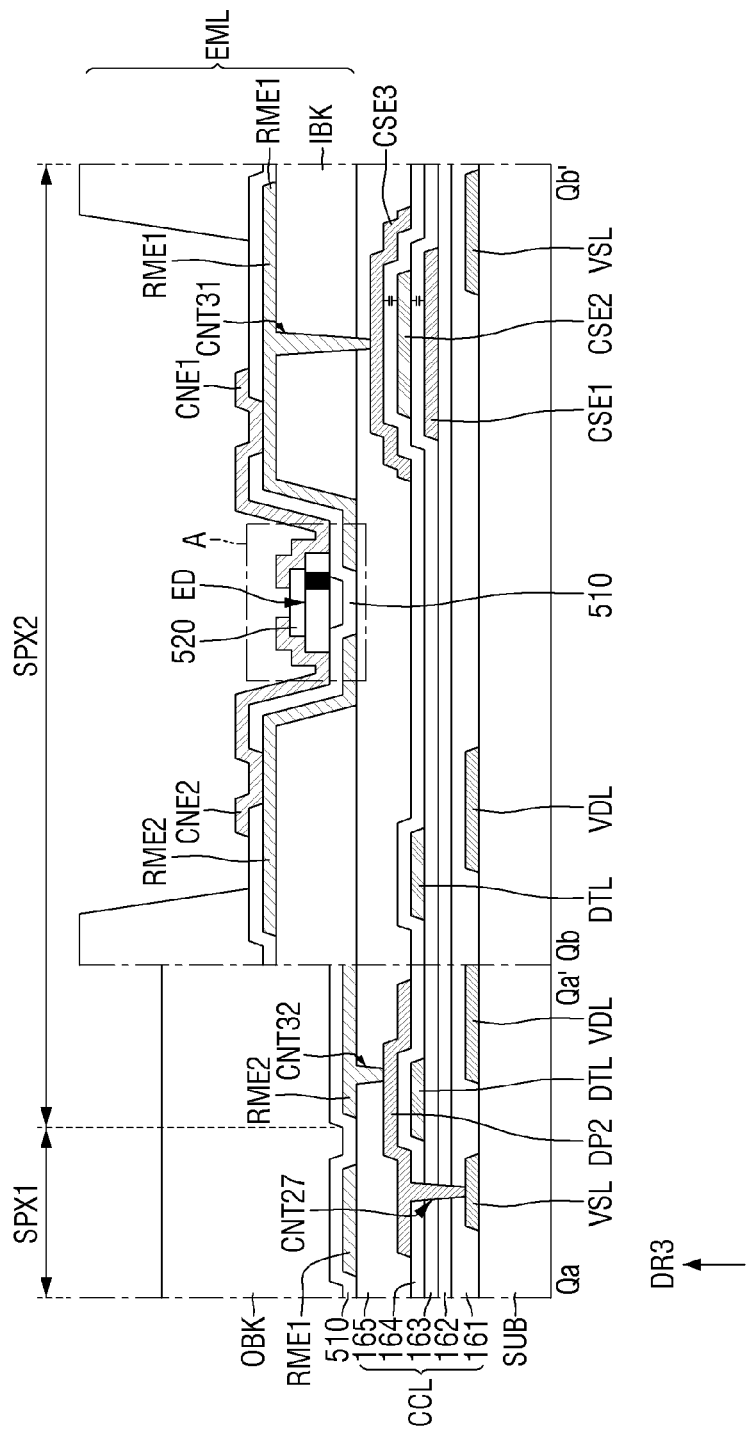
FIG. 14 is a schematic cross-sectional view taken along the lines Qa-Qa' and Qb-Qb' of FIGS. 12 and 13.

FIG. 14 is a schematic cross-sectional view taken along the lines Qa-Qa' and Qb-Qb' of FIGS. 12 and 13.

Hereinafter, a schematic cross-sectional structure of the display device 10 will be described with reference to FIGS. 12 to 13.

As described above, the light emitting element layer EML may be disposed on the circuit element layer CCL. In an embodiment, the light emitting element layer EML may include a first bank OBK, a second bank IBK, first and second insulating layers 510. 520, a light emitting element ED, and first and second electrodes RME1 and RME2, and first and second contact electrodes CNE1 and CNE2.

The second bank IBK may be directly disposed on the second interlayer insulating layer 165 of the circuit device layer CCL. One second bank IBK may have a shape extending in the first direction DR1, and may be disposed over another adjacent sub-pixel SPX. However, the disclosure is not limited thereto, and the second bank IBK may have a shape extending in the second direction DR2, but may be disposed in the light emission area EMA of each sub-pixel SPX such that the second bank IBK may not be disposed in the adjacent sub-pixel SPX in the second direction DR2. The length of the second bank IBK measured in the second direction DR2 may be formed larger than the length of the light emission area EMA measured in the second direction DR2, so that a part of the second bank IBK may be disposed to overlap the first bank OBK of the non-light emission area.

A plurality of second banks IBK may be disposed in one sub-pixel SPX. For example, in one sub-pixel SPX, two second banks IBK may be partially disposed in the light emission area EMA. The two second banks IBK may be spaced apart from each other in the first direction DR1. The light emitting element ED may be disposed between the second banks IBK spaced apart from each other in the first direction DR1. The number of second banks IBK disposed in the light emission area EMA of each sub-pixel SPX may vary according to the number of electrodes RME1 and RME2 or the arrangement of the light emitting elements ED.

The second bank IBK may have a structure in which at least a part of the second bank IBK protrudes from the top surface of the second interlayer insulating layer 165. The protrusion portion of the second bank IBK may have an inclined side surface, and the light emitted from the light emitting element ED may be reflected by the electrodes RME1 and RME2 disposed on the second bank IBK to be emitted in a display direction of the display device 10, for example, in an upward direction. The second bank IBK may provide an area in which the light emitting element ED may be disposed and may serve as a reflective wall for reflecting the light emitted from the light emitting element ED upward. The side surface of the second bank IBK may be inclined in a substantially linear shape, but the disclosure is not limited thereto, and the second bank IBK may have a substantially semi-circular or substantially semi-elliptical shape with a substantially curved outer surface. The second banks IBK may include an organic insulating material such as polyimide (PI), but the material thereof is not limited thereto.

The first electrode RME1 and the second electrode RME2 may be disposed on the second bank IBK. The first electrode RME1 and the second electrode RME2 may be disposed on the second bank IBK to cover or overlap the outer surface of the second bank IBK. The first electrode RME1 and the second electrode RME2 may extend outward from the side surface of the second bank IBK and spaced apart from each other to be partially disposed on the second interlayer insulating layer 165 exposed by the second bank IBK.

The first electrode RME1 and the second electrode RME2 may be disposed to be spaced apart from each other so as to expose a part of the second interlayer insulating layer 165 in the area between the second banks IBK. The first electrode RME1 and the second electrode RME2 may be electrically connected to the fourth conductive layer 150 of the circuit element layer CCL through third contact holes CNT31 and CNT32, respectively, to transmit an electrical signal for allowing the light emitting element ED to emit light.

The first and second electrodes RME1 and RME2 may electrically connected to the light emitting elements ED, respectively, and a predetermined voltage may be applied to the light emitting element ED to emit light. For example, the plurality of electrodes RME1 and RME2 may be electrically connected to the light emitting element ED disposed between the first electrode RME1 and the second electrode RME2 through the contact electrodes CNE1 and CNE2, and may transmit electrical signals applied to the electrodes RME1 and RME2 to the light emitting element ED through the contact electrodes CNE1 and CNE2.

For example, the first electrode RME1 may electrically contact the third capacitor electrode CSE3 of the fourth conductive layer 150 through the third contact hole CNT31 penetrating the second bank IBK and the second interlayer insulating layer 165 to expose the third capacitor electrode CSE3. Accordingly, the first electrode RME1 may be electrically connected to the first transistor T1 through the capacitor third electrode CSE3, so that the first power supply voltage may be applied to the first electrode RME1.

The second electrode RME2 may electrically contact the second conductive pattern DP2 of the fourth conductive layer 150 through the third contact hole CNT32 penetrating the second interlayer insulating layer 165 to expose the second conductive pattern DP2. The second conductive pattern DP2 may be electrically connected to the second voltage line VSL through the second contact hole CNT27, the second voltage line VSL being disposed adjacent to the left side of the second electrode RME2 disposed in the sub-pixel SPX in a plan view. For example, the second electrode RME2 disposed in the second sub-pixel SPX2 may be electrically connected to the second conductive pattern DP2 disposed in the first sub-pixel SPX1 and extending to a boundary area between the first sub-pixel SPX1 and the second sub-pixel SPX2. The second conductive pattern DP2 may be electrically connected to the second voltage line VSL disposed in the first sub-pixel SPX1, and the second electrode RME2 disposed in the second sub-pixel SPX2 may be electrically connected to the second voltage line VSL disposed in the first sub-pixel SPX1 through the second conductive pattern DP2 to allow a second power supply voltage to be applied to the second electrode RME2.

Each of the electrodes RME1 and RME2 may include a conductive material having high reflectance. For example, each of the electrodes RME1 and RME2 may include a metal such as silver (Ag), copper (Cu), or aluminum (Al) as the conductive material having high reflectance, or may include an alloy containing aluminum (Al), nickel (Ni), or lanthanum (La) as the conductive material having high reflectance. Each of the electrodes RME1 and RME2 may reflect the light emitted from the light emitting element ED and traveling toward the or a side surface of the second bank IBK in the upward direction of each sub-pixel SPX.

However, the disclosure is not limited thereto, and each of the electrodes RME1 and RME2 may further include a transparent conductive material. For example, each of the electrodes RME1 and RME2 may include a material such as ITO, IZO, or ITZO. In an embodiment, each of the electrodes RME may have a structure in which one or more layers of a transparent conductive material and one or more metal layers having high reflectance may be stacked, or may be formed as one layer including the structure. For example, each of the electrodes RME1 and RME2 may have a stacked structure of ITO/Ag/ITO/, ITO/Ag/IZO, or ITO/Ag/ITZO/IZO.

Meanwhile, in the case of applying an alignment signal in the process of aligning the light emitting elements ED, only in a case that an electric field may be applied only to the first and second electrodes RME1 and RME2, the degree of alignment in which the light emitting elements ED may be aligned on the first and second electrodes RME1 and RME2 may be increased. A signal for alignment of the light emitting elements ED applied to the first and second electrodes RME1 and RME2 may be applied through the first and second voltage lines VDL and VSL. In a case that an electric field may also be formed between the first and second voltage lines VDL and VSL and the first and second electrodes RME1 and RME2 and the electric field may be applied, the electric field may be applied to not only an area between the first and second electrodes RME1 and RME2 but also other areas, so that the degree of alignment of the light emitting elements ED may be decreased. Accordingly, the first voltage line VDL and the second voltage line VSL may be disposed far away from the first and second electrodes RME1 and RME2 in the thickness direction (for example, in the third direction DR3), thereby reducing the intensity of the electric field formed between the first and second voltage lines VDL and VSL and the first and second electrodes RME1 and RME2. Therefore, in an embodiment, the first and second voltage lines VDL and VSL may be formed as the first conductive layer 110 to increase the distance between the first and second electrodes RME1 and RME2 and the first and second voltage lines VDL and VSL, thereby increasing the degree of alignment of the light emitting elements ED or preventing an increase in a detaching rate of the light emitting elements ED.

Further, the second voltage line VSL may be disposed to overlap the first capacitor electrode CSE1, the second capacitor electrode CSE2, and the third capacitor electrode CSE3, which may be disposed on the second voltage line VSL, thereby preventing an electric field from being applied by an electric field that may be formed between the second voltage line VSL and the first and first electrodes RME1 and RME2. Accordingly, the width of the second voltage line VSL in one direction may be smaller than that of the first capacitor electrode CSE1, the second capacitor electrode CSE2, and the third capacitor electrode CSE3. In a case that the width of the second voltage line VSL in one direction may be smaller than that of the first capacitor electrode CSE1, the second capacitor electrode CSE2, and the third capacitor electrode CSE3, the second voltage line VSL may be completely blocked, thereby preventing an electric field from being applied by an electric field that may be formed between the second voltage line VSL and the first and first electrodes RME1 and RME2. Therefore, it may be possible to increase the degree of alignment of the light emitting elements ED or prevent an increase in detaching rate of the light emitting elements ED.

The first insulating layer 510 may be disposed on the plurality of electrodes RME1 and RME2 and the second bank IBK. The first insulating layer 510 may be disposed to cover or overlap the second bank IBK and the first electrode RME1 and the second electrode RME2, and may be disposed to expose parts of the upper surfaces of the first electrode RME1 and the second electrode RME2. An opening may be formed or disposed in the first insulating layer 510 to expose the upper surface of a portion disposed on the second bank IBK of the upper surfaces of the electrodes RME1 and RME2, and the contact electrodes CNE1 and CNE2 may electrically contact the electrodes RME1 and RME2 through the opening.

In an embodiment, the first insulating layer 510 may have a step between the first electrode RME1 and the second electrode RME2 such that a part of the upper surface thereof may be depressed. As the first insulating layer 510 may be disposed to cover or overlap the first electrode RME1 and the second electrode RME2, the first insulating layer 510 may be formed to be stepped therebetween. However, the disclosure is not limited thereto. In an embodiment, a material forming the second insulating layer 520 to be described later may fill the empty space between the first insulating layer 510 and the light emitting element ED. However, the disclosure is not limited thereto, and the first insulating layer 510 may not have a step between the first electrode RME1 and the second electrode RME2. For example, the first insulating layer 510 may include a flat upper surface such that the light emitting element ED may be disposed between the first electrode RME1 and the second electrode RME2.

The first insulating layer 510 may protect the first electrode RME1 and the second electrode RME2 and insulate them from each other. For example, the first insulating layer 510 may prevent the light emitting element ED disposed on the first insulating layer 510 from being damaged by direct contact with other members.

The first bank OBK may be formed or disposed to have a height greater than that of the second bank IBK. The first bank OBK may prevent an ink from overflowing to the adjacent sub-pixel SPX in the inkjet printing process of the manufacturing process of the display device 10, thereby separating inks in which different light emitting elements ED may be dispersed for each sub-pixel SPX so as not to mix the inks with each other. As one second bank IBK may be disposed over the sub-pixels SPX neighboring in or adjacent to the first direction DR1, a part of a portion of the first bank OBK extending in the second direction DR2 may be disposed on the second bank IBK. The first bank OBK, like the second bank IBK, may include polyimide (PI), but the material thereof is not limited thereto.

The light emitting element ED may be disposed on the first insulating layer 510. The plurality of light emitting elements ED may be arranged or disposed to be spaced apart from each other along the second direction DR2 in which the electrodes RME1 and RME2 extend, and may thus be aligned substantially in parallel to each other. The light emitting element ED may have a shape extending in one direction, and the direction in which each of the electrodes RME1 and RME2 extends may be substantially perpendicular to the direction in which the light emitting element ED extends. However, the disclosure is not limited thereto, and the light emitting element ED may be disposed obliquely in the direction in which each of the electrodes RME1 and RME2 extends.

The light emitting element ED may include semiconductor layers doped with different conductive types. The light emitting element ED may include a plurality of semiconductor layers, and may thus be aligned such that one or an end of the light emitting element ED may face a specific or predetermined direction according to a direction of an electric field generated on the electrodes RME1 and RME2. For example, the light emitting element ED may include a light emitting layer ("36" in FIG. 15) to emit light of a specific wavelength band. The light emitting elements ED arranged or disposed in each sub-pixel SPX may emit light of different wavelength bands depending on the material forming the light emitting layer 36. However, the disclosure is not limited thereto, and the light emitting elements ED arranged or disposed in each sub-pixel SPX may emit light of the same color.

The second insulating layer 520 may be partially disposed on the light emitting element ED disposed between the first electrode RME1 and the first electrode RME2. The second insulating layer 520 may be disposed to partially surround the outer surface of the light emitting element ED. The second insulating layer 520 may be disposed on the light emitting element ED, but may expose one or an end and the other or another end of the light emitting element ED. A portion of the second insulating layer 520, the portion being disposed on the light emitting element ED, may have a shape extending in the second direction DR2 between the first electrode RME1 and the first electrode RME2 in a plan view. For example, the second insulating layer 520 may form a substantially linear or island-shaped or isolated shaped pattern in each sub-pixel SPX. Although not shown in the drawings, as described above, the material constituting the second insulating layer 520 may be disposed between the first electrode RME1 and the first electrode RME2, and may fill the empty space between the first insulating layer 510 formed by being depressed and the light emitting element ED.

The second insulating layer 520 may serve to protect the light emitting element ED and fix the light emitting element ED in the manufacturing process of the display device 10.

A plurality of contact electrodes CNE1 and CNE2 may be disposed on the second insulating layer 520. The first contact electrode CNE1 and the second contact electrode CNE2 of the plurality of contact electrodes CNE1 and CNE2 may be disposed on a part of the first electrode RME1 and a part of the second electrode RME2, respectively. The first contact electrode CNE1 may be disposed on the first electrode RME1, the second contact electrode CNE2 may be disposed on the second electrode RME2, and each of the first contact electrode CNE1 and the second contact electrode CNE2 may have a shape extending in the second direction DR2.

In an embodiment, the widths of the first contact electrode CNE1 and the second contact electrode CNE2 measured in one direction may be smaller than the widths of the first electrode RME1 and the second electrode RME2 measured in the one direction, respectively. The first contact electrode CNE1 and the second contact electrode CNE2 may be in electrically contact with one or an end and the other or another end of the light emitting element ED, respectively, and may be disposed to overlap pars of the upper surfaces of the first electrode RME1 and the second electrode RME2, respectively.

The plurality of contact electrodes CNE1 and CNE2 may electrically contact the light emitting element ED and the electrodes RME1 and RME2, respectively. One or an end of the light emitting element ED may be electrically connected to the first electrode RME1 through the first contact electrode CNE1, and the other or another end thereof may be electrically connected to the second electrode RME2 through the second contact electrode CNE2.

Although it is shown in the drawings that one first contact electrode CNE1 and one second contact electrode CNE2 may be disposed in one sub-pixel SPX, the disclosure is not limited thereto. The number of first and second contact electrodes CNE1 and CNE2 may vary depending on the number of first and second electrodes RME1 and RME2 disposed in each sub-pixel SPX.

Each of the contact electrodes CNE1 and CNE2 may include a conductive material. For example, each of the contact electrodes CNE1 and CNE2 may include ITO, IZO, ITZO, or aluminum (Al). For example, the contact electrodes CNE1 and CNE2 may include a transparent conductive material, and light emitted from the light emitting element ED may pass through the contact electrodes CNE1 and CNE2 and travel toward the electrodes RME1 and RME2. However, the disclosure is not limited thereto.

Although not shown in the drawings, an insulating layer may be further disposed on the contact electrodes CNE1 and CNE2 and the second bank BNL2 to cover or overlap them. The insulating layer may be disposed entirely on the first substrate SUB, and may function to protect members arranged or disposed thereon from external environments.

Each of the above-described first insulating layer 510 and second insulating layer 520 may include an inorganic insulating material or an organic insulating material. In an embodiment, each of the first insulating layer 510 and the second insulating layer 520 may include an inorganic insulating material such as silicon oxide (SiOx), silicon nitride (SiNx), silicon oxynitride (SiOxNy), aluminum oxide ($Al_2O_3$), or aluminum nitride (AlN). Alternatively, each of the first insulating layer 510 and the second insulating layer 520 may include an organic insulating material such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, or polymethylmethacrylate-polycarbonate synthetic resin. However, the disclosure is not limited thereto.

Figure 15:
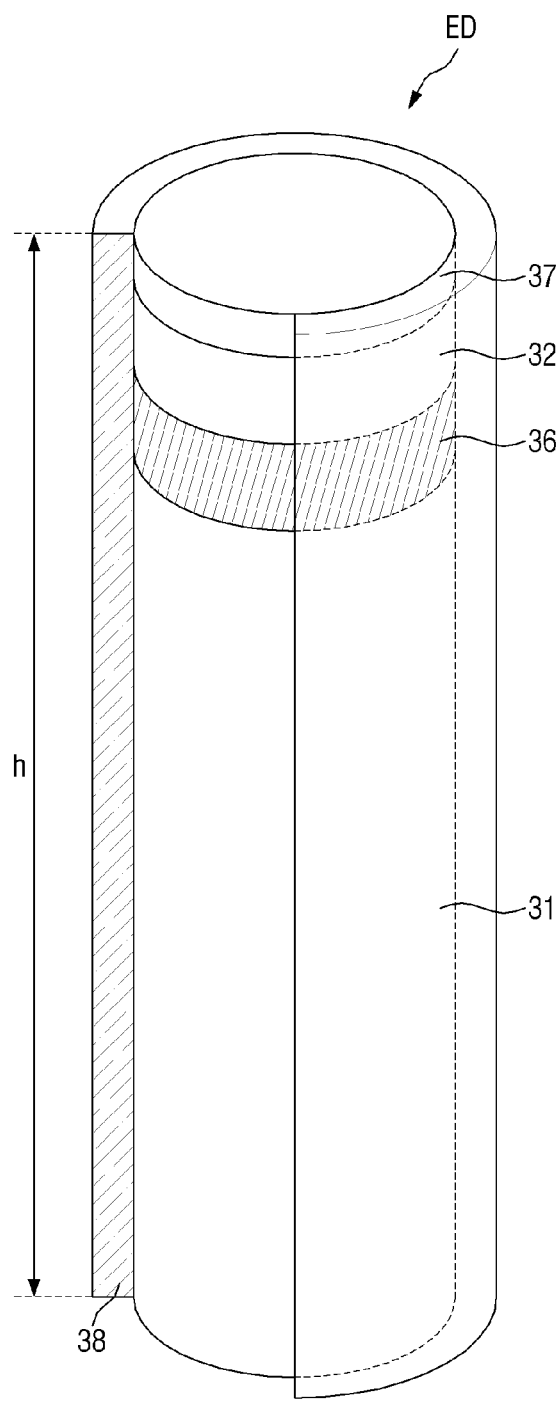
FIG. 15 is a schematic perspective view of a light emitting element according to an embodiment.

FIG. 15 is a schematic perspective view of a light emitting element according to an embodiment.

The light emitting element ED may be a light emitting diode. For example, the light emitting element ED may be an inorganic light emitting diode having a size of that of a micrometer or nanometer and including an inorganic material. In a case that an electric field may be formed in a specific or predetermined direction between two electrodes facing each other, the inorganic light emitting diode may be aligned between the two electrodes having a polarity formed thereon. The light emitting element ED may be aligned between the electrodes by an electric field formed on the two electrodes.

The light emitting element ED according to an embodiment may have a shape extending in one direction. The light emitting element ED may have a shape such as a rod, a wire, or a tube. In an embodiment, the light emitting element ED may be substantially cylindrical or substantially rod-shaped. However, the shape of the light emitting element ED is not limited thereto, and the light emitting element ED may have a shape such as a substantially regular cube, a rectangular parallelepiped, or a polygonal column such as hexagonal column, or may have a shape extending in one direction and having a partially inclined outer surface. For example, the light emitting element may have various shapes. A plurality of semiconductors included in the light emitting element ED, which will be described later, may have a structure in which they may be sequentially arranged or disposed or stacked along the one direction.

The light emitting element ED may include a semiconductor layer doped with an arbitrary conductive type (for example, p-type or n-type) impurity. The semiconductor layer may emit light of a specific wavelength band by transmission of an electric signal applied from an external power source.

Referring to FIG. 15, the light emitting element ED may include a first semiconductor layer 31, a second semiconductor layer 32, a light emitting layer 36, an electrode layer 37, and an insulating layer 38.

The first semiconductor layer 31 may be an n-type semiconductor layer. For example, in a case that the light emitting element 300 emits light of a blue wavelength band, the first semiconductor 31 may include a semiconductor material having a chemical formula of $Al_xGa_yIn_{1-x-y}N$ ($0 \leq x \leq 1$, $0 \leq y \leq 1$, $0 \leq x+y \leq 1$). The semiconductor material may be at least one of AlGaInN, GaN, AlGaN, InGaN, AlN, and InN, each being doped with n-type impurities. The first semiconductor 31 may be doped with an n-type dopant, and for example, the n-type dopant may be Si, Ge, or Sn. In an embodiment, the first semiconductor 310 may be n-GaN doped with n-type Si. The length of the first semiconductor layer 31 may be in a range of about 1.5 m to about 5 μm, but is not limited thereto.

The second semiconductor 32 may be disposed on the light emitting layer 36 to be described later. The second semiconductor 32 may be a p-type semiconductor layer. For example, in a case that the light emitting element ED emits light of a blue wavelength band or a green wavelength band, the second semiconductor 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may be at least one of AlGaInN, GaN, AlGaN, InGaN, AlN, and InN, each being doped with p-type impurities. The second semiconductor 32 may be doped with a p-type dopant, and for example, the second dopant may be Mg, Zn, Ca, Se, or Ba. In an embodiment, the second semiconductor 32 may be p-GaN doped with p-type Mg. The length of the first semiconductor layer 32 may be in a range of about 0.05 μm to about 0.10 μm, but is not limited thereto.

Meanwhile, although it is shown in FIG. 15 that each of the first semiconductor 31 and the second semiconductor 32 may be formed as one layer, the disclosure is not limited thereto. In an embodiment, each of the first semiconductor 31 and the second semiconductor 32 may further include a larger number of layers, for example, clad layers or tensile strain barrier reducing (TSBR) layers depending on the material of the light emitting layer 36.

The light emitting layer 36 may be disposed between the first semiconductor layer 310 and the second semiconductor layer 320. The light emitting layer 36 may include a material of a single or multiple quantum well structure. In a case that the light emitting layer 36 may include a material of a multiple quantum well structure, the light emitting layer 36 may have a structure in which quantum layers and well layers may be alternately laminated. The light emitting layer 36 may emit light by the combination of electron-hole pairs according to an electrical signal applied through the first conductive semiconductor layer 31 and the second conductive semiconductor layer 32. For example, in a case that the light emitting layer 36 emits light of a blue wavelength band, the light emitting layer 36 may include a material such as AlGaN or AlGaInN. In a case that the light emitting layer 36 has a multiple quantum well structure in which quantum layers and well layers may be alternately laminated, the quantum wells may include a material such as AlGaN or AlGaInN, and the well layers may include a material such as GaN or AlInN. In an embodiment, the light emitting layer 36 may include quantum wells each containing AlGaInN and well layers each containing AlInN, and thus the active layer 330 may emit blue light having a central wavelength band in a range of about 450 nm to about 495 nm.

However, the disclosure is not limited thereto, and the light emitting layer 36 may have a structure in which semiconductor materials having high bandgap energy and semiconductor materials having low bandgap energy may be alternately laminated, and may include other group 3 to group 5 semiconductor materials depending on the wavelength bad of light. The light emitted from the light emitting layer 36 is not limited to light of a blue wavelength band, and in some cases, the light emitting layer 36 may emit light of a red or green wavelength band. The length of the light emitting layer 36 may be in a range of about 0.05 µm to about 0.10 µm, but is not limited thereto.

Meanwhile, the light emitted from the light emitting layer 36 may be emitted not only to the outer surface of the light emitting element ED in the length direction, but also to both side surfaces thereof in the length direction.

The electrode layer 37 may be an ohmic contact electrode. However, the disclosure is not limited thereto, and the electrode layer 37 may be a Schottky contact electrode. The light emitting element ED may include at least one electrode layer 37. Although it is shown in FIG. 15 that the light emitting element ED may include one electrode layer 37, the disclosure is not limited thereto. In some cases, the light emitting element ED may include a larger number of electrode layers 37, or the electrode layer 37 may be omitted. The description of the light emitting element ED to be described later may be equally applied even if the number of electrode layers 37 may be changed or the light emitting element ED may include other structures.

In the display device 10 according to an embodiment, in a case that the light emitting element ED may be electrically connected to an electrode or a contact electrode, the electrode layer 37 may reduce a resistance between the light emitting element ED and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. The electrode layer 370 may include the same or similar material, and may include different materials from each other, but the disclosure is not limited thereto.

The insulating layer 38 may be disposed to surround the outer surfaces of the plurality of semiconductors and electrode layers. In an embodiment, the insulating layer 38 may be disposed to surround at least the outer surface of the light emitting layer 36, and may extend in one direction in which the light emitting element ED extends. The insulating layer 38 may function to protect the above members. For example, the insulating layer 38 may be formed or disposed to surround the side surfaces of the members, and may be formed such that both ends of the light emitting element ED in the length direction may be exposed.

Although it is shown in the drawing that the insulating layer 38 extends in the length direction of the light emitting element ED to cover or overlap the first semiconductor layer 31 to the side surface of the electrode layer 37, the disclosure is not limited thereto. The insulating layer 38 may cover or overlap only the outer surfaces of some or a predetermined number of the semiconductor layers including the light emitting layer 36 or may cover or overlap only a part of the outer surface of the electrode layer 37 to partially expose the outer surface of each electrode layer 37. Further, the insulating layer 38 may have a rounded upper surface in a cross section in an area adjacent to at least one or an end of the light emitting element ED.

The thickness of the insulating layer 38 may have a range of about 10 nm to about 1.0 µm, but is not limited thereto. For example, the thickness of the insulating layer 38 may be about 40 nm.

The insulating layer 38 may include a material having insulating properties, for example, silicon oxide (SiOx), silicon nitride (SiNx), silicon oxynitride (SiOxNy), aluminum nitride (AlN), or aluminum oxide ($Al_2O_3$). Thus, the light emitting layer 36 may prevent an electrical short that may occur in a case that the light emitting layer 36 may be in direct contact with an electrode through which an electrical signal may be transmitted to the light emitting element ED. Further, since the insulating layer 38 may protect the outer surface of the light emitting element ED as well as the light emitting layer 36, it may be possible to prevent the deterioration in light emission efficiency.

In an embodiment, the outer surface of the insulating layer 38 may be surface-treated. The light emitting elements ED may be aligned by being sprayed onto the electrodes in a state in which they may be dispersed in a predetermined ink. Here, the surface of the insulating layer 38 may be hydrophobically or hydrophilically treated in order to maintain the light emitting elements ED in a dispersed state without being aggregated with other adjacent light emitting elements ED in the ink.

The light emitting element ED may have a length h in a range of about 1 µm to about 10 m or in a range of about 2 m to about 6 m, and for example in a range of about 3 m to about 5 µm. Further, the light emitting element ED may have a diameter in a range of about 300 nm to about 700 nm, and may have an aspect ratio in a range of about 1.2 to about 100. However, the disclosure is not limited thereto, and the plurality of light emitting elements ED included in the display device 10 may have different diameters from each other according to a difference in composition of the light emitting layer 36. For example, the light emitting element may have a diameter of about 500 nm.

Figure 16:
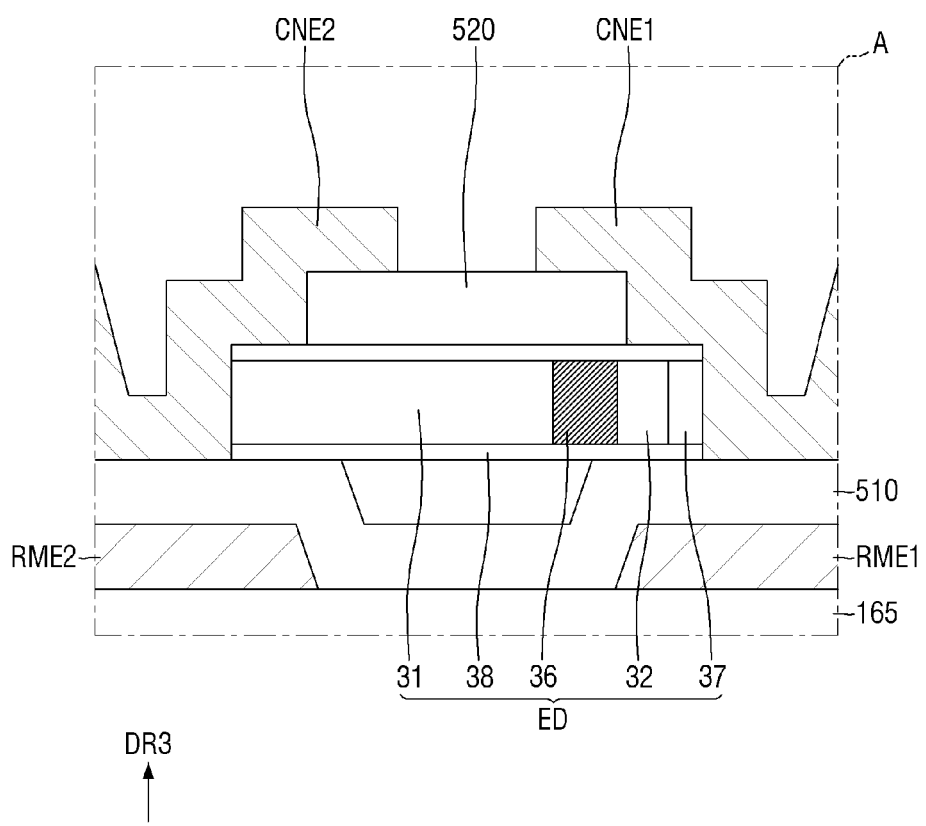
FIG. 16 is an enlarged view of the area A in FIG. 14.

FIG. 16 is an enlarged view of the area A in FIG. 14.

An area where the first and second contact electrodes CNE1 and CNE2 may electrically contact the light emitting element ED will be described with reference to FIGS. 14 to 16.

The semiconductor layer may be exposed on both end surfaces of the light emitting element ED in the extension direction, and the first contact electrode CNE1 and the second contact electrode CNE2 may electrically contact the light emitting element ED on the end surface where the semiconductor layer may be exposed. For example, the first semiconductor layer 31 of the light emitting element ED may be disposed on the second electrode RME2, and the second semiconductor layer 32 of the light emitting element ED may be disposed on the first electrode RME1. The first contact electrode CNE1 may electrically contact the electrode layer 37 disposed in one or an end region of the light emitting element ED. The second contact electrode CNE2 may electrically contact the first semiconductor layer 31 disposed in the other or another end region of the light emitting element ED. Since the insulating layer 38 may not be formed or disposed on the end surface of the light emitting element ED and a part of the semiconductor layer may be exposed, the exposed semiconductor layer may electrically contact the contact electrodes CNE1 and CNE2. However, the disclosure is not limited thereto. In some cases, in the light emitting element ED, at least a part of the insulating layer 30 may be removed, and thus both end side surfaces of the semiconductor layers may be partially exposed. The exposed side surfaces of the semiconductor layers may directly contact the contact electrodes CNE1 and CNE2.

Hereinafter, an embodiment of the display device 10 will be described with reference to other drawings.

Figure 17:
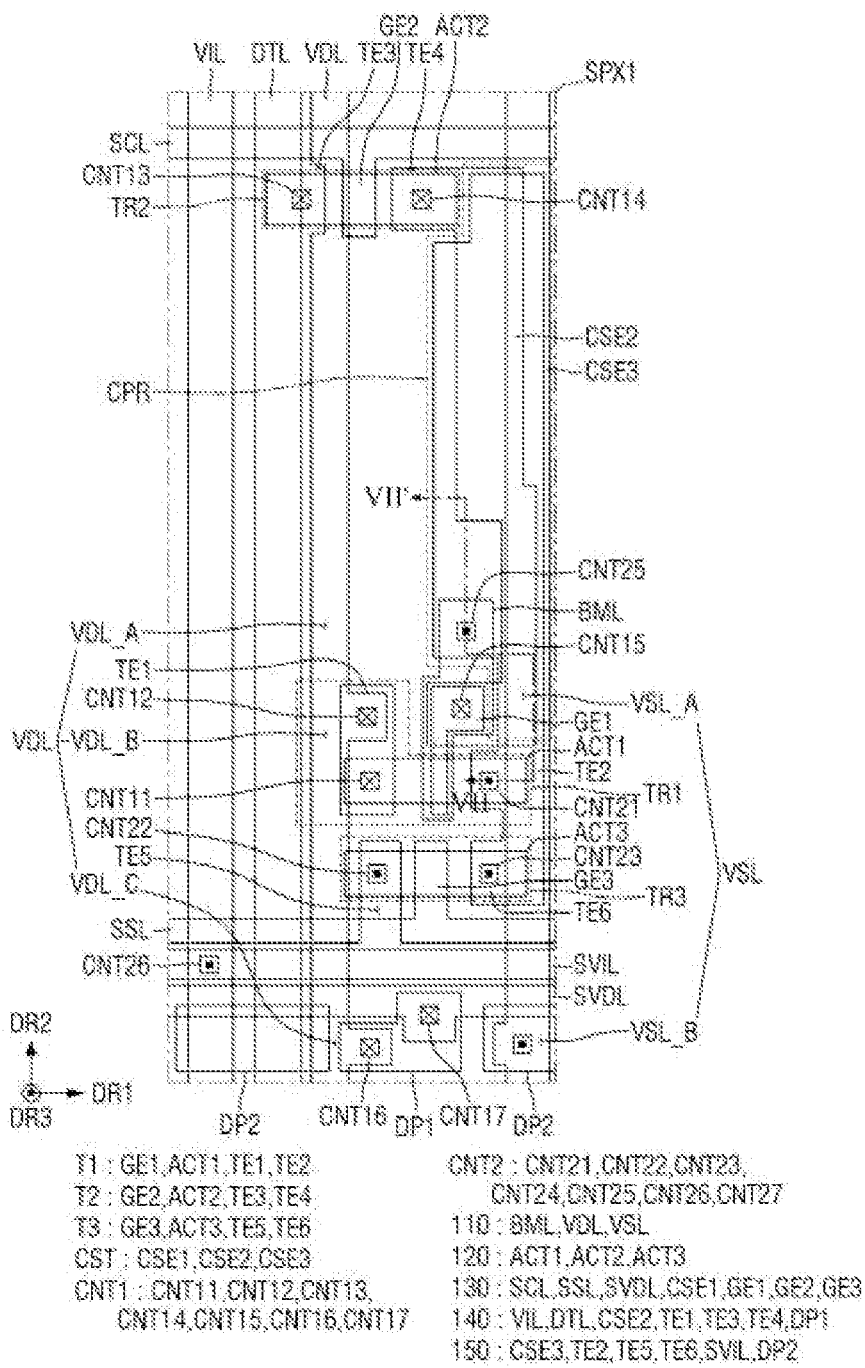
FIG. 17 is a layout view illustrating a plurality of conductive layers and a plurality of semiconductor layers arranged or disposed in one pixel of a circuit element layer according to an embodiment.
Figure 18:
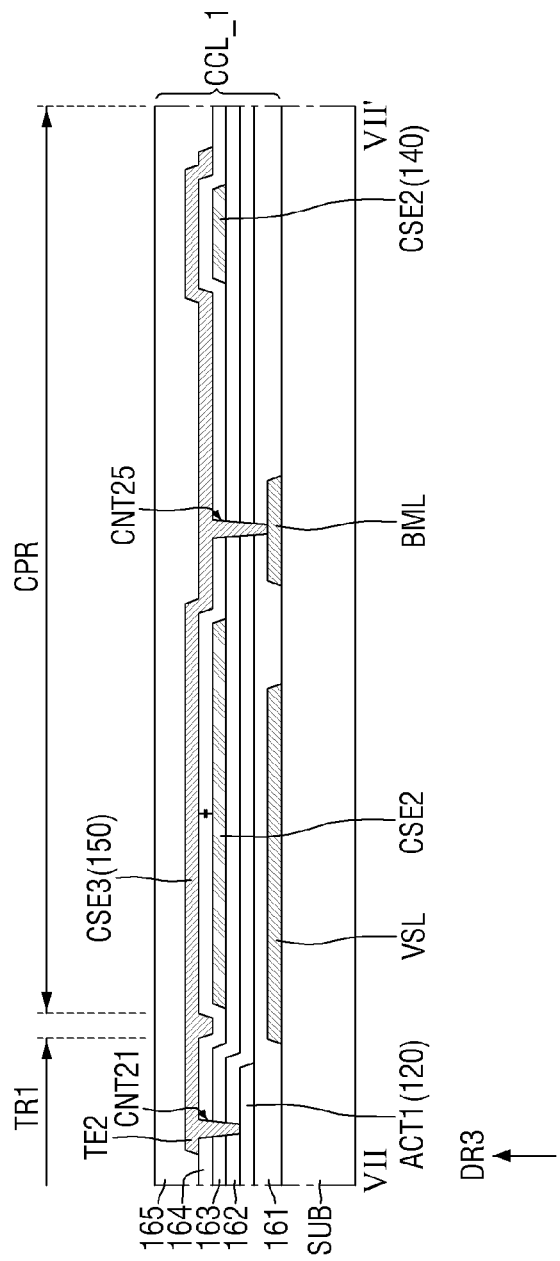
FIG. 18 is a schematic cross-sectional view taken along the line VII-VII' in FIG. 17.

FIG. 17 is a layout view illustrating a plurality of conductive layers and a plurality of semiconductor layers arranged or disposed in one pixel of a circuit element layer according to an embodiment. FIG. 18 is a schematic cross-sectional view taken along the line VII-VII' in FIG. 17.

Referring to FIGS. 17 and 18, an embodiment may be different from the aforementioned embodiment of FIG. 6 in that, in a circuit element layer CCL_1 of the display device 10, the second conductive layer 120 may not include the first capacitor electrode CSE1.

For example, the display device 10 may not include the first capacitor electrode CSE1 and the second contact hole CNT24 (refer to FIG. 6) electrically connecting the third capacitor electrode CSE3 and the first capacitor electrode CSE1. Accordingly, in the capacitor CST of the display device 10, the second capacitor electrode CSE2 of the third conductive layer 140, the third capacitor electrode CSE3 of the fourth conductive layer 150, and the passivation layer 164 interposed therebetween may form the capacitor CST.

In an embodiment, the area of the electrodes forming the capacitor CST may be reduced from the sum of planar areas of the first capacitor electrode CSE1 and the third capacitor electrode CSE3 into the planar area of the third capacitor electrode CSE3 to reduce capacitance, but in a case that the planar area of the third capacitor electrode CSE3 of the fourth conductive layer 150 may be sufficient, separately, the patterning process of forming the capacitor first electrode CSE1 by the first conductive layer 110 may be omitted. Accordingly, in a case that the planar area of the third capacitor electrode CSE3 of the fourth conductive layer 150 may be sufficient, the capacitor first electrode CSE1 formed by the first conductive layer 110 may be omitted, thereby improving the efficiency of the manufacturing process of the display device. Further, defects that may occur in the process of forming the second contact hole CNT2 penetrating the buffer layer 161, the gate insulating layer 162, the first interlayer insulating layer 163, and the passivation layer 164 in order to electrically connect the fourth conductive layer 150, which may be the uppermost conductive layer of the circuit element layer CCL_1, to the first capacitor electrode CSE1 of the first conductive layer 110, which may be the lowermost layer of the circuit element layer CCL_1, may be reduced.

Figure 19:
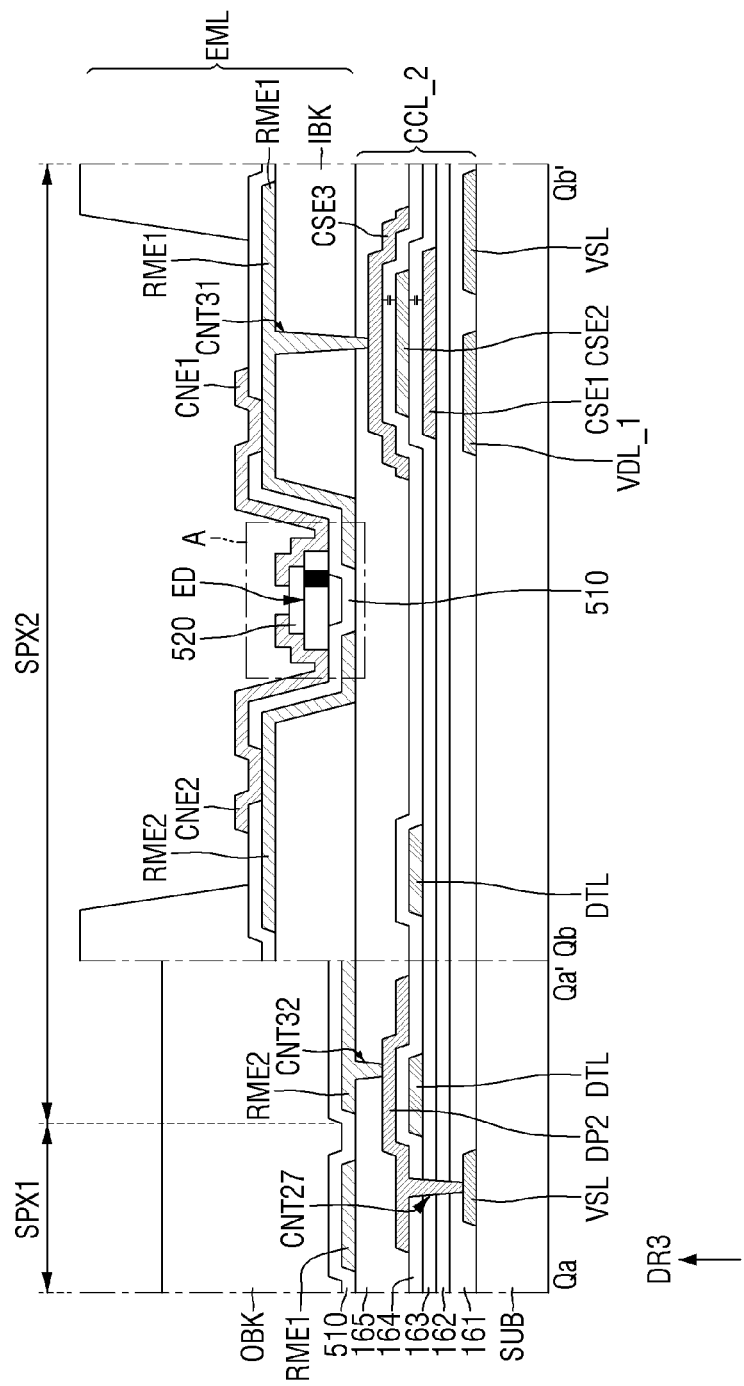
FIG. 19 is a schematic cross-sectional view of a display device according to an embodiment.

FIG. 19 is a schematic cross-sectional view of a display device according to an embodiment.

Referring to FIG. 19, a first voltage line VDL_1 and a second voltage line VSL included in a circuit element layer CCL_2 of the display device 10 according to an embodiment may be disposed to overlap the first capacitor electrode CSE1, the second capacitor electrode CSE2, and the third capacitor electrode CSE3 in the third direction.

As described above, since the first voltage line VDL_1 and the second voltage line VSL may be formed by the first conductive layer 110, the first voltage line VDL_1 and the second voltage line VSL may be far away from the first electrode RME1 and second electrode RME2 in the thickness direction, thereby reducing the intensity of the electric field formed between the first and second voltage lines VDL_1 and VSL and the first electrode RME1 or between the first and second voltage lines VDL_1 and VSL and the second electrode RME2 in the process of aligning the light emitting elements ED. Further, both the first voltage line VDL_1 and the second voltage line VSL may be disposed under or below the first capacitor electrode CSE1, the second capacitor electrode CSE2, and the third capacitor electrode CSE3 forming the capacitor CST to overlap them in the third direction DR3, an electric field formed between the first and second voltage lines VDL_1 and VSL and the first and second electrodes RME1 and RME2 may be blocked by the first capacitor electrode CSE1, the second capacitor electrode CSE2, and the third capacitor electrode CSE3. Accordingly, the generation of unnecessary electric fields by the first voltage line VDL_1 and the second voltage line VSL may be minimized to reduce the detaching rate of the light emitting elements ED in the process of aligning the light emitting elements ED, thereby improving the reliability of the display device 10 and reducing the material cost of the display device 10.

Although embodiments have been disclosed for illustrative purposes, those skilled in the art will appreciate that various modifications, additions and substitutions are possible, without departing from the scope and spirit of the disclosure as disclosed in the accompanying claims.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device, comprising:
a first voltage line disposed on a substrate, a first power supply voltage being applied to the first voltage line;
a buffer layer disposed on the first voltage line;
a first transistor including a semiconductor pattern disposed on the buffer layer;
a first insulating layer disposed on the semiconductor pattern of the first transistor;
a first capacitor electrode disposed on the first insulating layer;
a second insulating layer disposed on the first capacitor electrode;
a first electrode and a second electrode disposed on the second insulating layer and spaced apart from each other, and a second voltage line disposed on the substrate, a second power supply voltage being applied to the second voltage line, wherein the second electrode is electrically connected to the first voltage line, the first voltage line overlaps the first capacitor electrode in a thickness direction of the substrate, the buffer layer is disposed on the second voltage line, and the second voltage line overlaps the second electrode in the thickness direction of the substrate.

2. The display device of claim 1, further comprising:
a second capacitor electrode disposed on the second insulating layer and overlapping the first capacitor electrode in the thickness direction of the substrate, wherein the first electrode and the second electrode are disposed on the second capacitor electrode, and the second capacitor electrode overlaps the first voltage line in the thickness direction of the substrate.

3. The display device of claim 2, further comprising:
a third capacitor electrode disposed on the first insulating layer and overlapping the first capacitor electrode in the thickness of the substrate; and a third insulating layer disposed on the third capacitor electrode, wherein the first capacitor electrode is disposed on the third insulating layer, and the third capacitor electrode overlaps the first voltage line in the thickness direction of the substrate.

4. The display device of claim 3, wherein
the third capacitor electrode overlaps the second capacitor electrode in the thickness direction of the substrate, and the second capacitor electrode is electrically connected to the third capacitor electrode through a contact hole penetrating the second insulating layer and the third insulating layer.

5. The display device of claim 2, wherein the first electrode is electrically connected to the second capacitor electrode.

6. The display device of claim 5, wherein
the second capacitor electrode overlaps the first electrode in the thickness direction of the substrate, and the second capacitor electrode is disposed between the first electrode and the first voltage line.

7. The display device of claim 2, further comprising:
a light blocking layer disposed on the substrate, wherein
the buffer layer is disposed on the light blocking layer, and
the second capacitor electrode is electrically connected to the light blocking layer.

8. The display device of claim 1, wherein the first transistor comprises:
a gate electrode disposed on the first insulating layer; and
a first electrode disposed on the second insulating layer, wherein the first electrode of the first transistor is electrically connected to the second voltage line.

9. The display device of claim 1, further comprising:
a second transistor including:
a semiconductor pattern disposed on the buffer layer; and
a first electrode disposed on the first insulating layer; and
a second capacitor electrode disposed on the second insulating layer, wherein the first electrode of the second transistor is electrically connected to the semiconductor pattern of the second transistor through a first contact hole penetrating the first insulating layer, and the second capacitor electrode does not overlap the first contact hole in the thickness direction of the substrate.

10. The display device of claim 1, further comprising:
a second transistor including a semiconductor pattern disposed on the buffer layer;
a gate electrode of the first transistor disposed on the first insulating layer;
a third insulating layer disposed on the gate electrode of the first transistor, wherein the second transistor includes a first electrode disposed on the third insulating layer, the first transistor includes a first electrode disposed on the second insulating layer, the second insulating layer is disposed on the third insulating layer, the first electrode of the second transistor is electrically connected to the gate electrode of the first transistor through a first contact hole penetrating the third insulating layer, and the first electrode of the first transistor does not overlap the first contact hole in the thickness direction of the substrate.

11. The display device of claim 10, further comprising:
a second capacitor electrode disposed on the second insulating layer and overlapping the first capacitor electrode in the thickness direction of the substrate, wherein the second capacitor electrode does not overlap the first contact hole in the thickness direction of the substrate.

12. The display device of claim 1, further comprising:
a light emitting element disposed on the first electrode and the second electrode, wherein an end of the light emitting element is electrically connected to the first electrode, and another end of the light emitting element is electrically connected to the second electrode.

13. A display device, comprising:
a first voltage line disposed on a substrate, a first power supply voltage being applied to the first voltage line;
a buffer layer disposed on the first voltage line;
a semiconductor layer disposed on the buffer layer and including a semiconductor pattern of a first transistor and a semiconductor pattern of a second transistor;
a first insulating layer disposed on the semiconductor layer;
a first conductive layer disposed on the first insulating layer and including a gate electrode of the first transistor;
a second insulating layer disposed on the first conductive layer;
a second conductive layer disposed on the second insulating layer and including a first capacitor electrode and a first electrode of the second transistor;
a third insulting layer disposed on the second conductive layer;
a third conductive layer disposed on the third insulating layer and including a first electrode of the first transistor, wherein the first electrode of the second transistor is electrically connected to the gate electrode of the first transistor through a first contact hole penetrating the second insulating layer, the third conductive layer does not overlap the first contact hole in a thickness direction of the substrate, the third conductive layer includes a second capacitor electrode, and the second capacitor electrode overlaps the first capacitor electrode in the thickness direction of the substrate.

14. The display device of claim 13, wherein the first electrode of the second transistor is electrically connected to the semiconductor pattern of the second transistor through a second contact hole penetrating the first insulating layer and the second insulating layer, and the third conductive layer does not overlap the second contact hole in the thickness direction of the substrate.

15. The display device of claim 13, further comprising:

a fourth insulating layer disposed on the third conductive layer; and a first electrode and a second electrode disposed on the fourth insulating layer and spaced apart from each other, wherein the second electrode is electrically connected to the first voltage line, and the first voltage line overlaps the first capacitor electrode in the thickness direction of the substrate.

16. The display device of claim 15, wherein the first conductive layer includes a third capacitor electrode overlapping the first capacitor electrode in the thickness direction of the substrate, and the third capacitor electrode is electrically connected to the second capacitor electrode.

17. The display device of claim 13, further comprising:

a second voltage line disposed on the substrate, a second power supply voltage being applied to the second voltage line, wherein the buffer layer is disposed on the second voltage line.

\* \* \* \* \*